(12) United States Patent
Heitsch et al.

(10) Patent No.: US 8,858,707 B2
(45) Date of Patent: Oct. 14, 2014

(54) SYNTHESIS OF SILICON NANORODS

(75) Inventors: Andrew T. Heitsch, Austin, TX (US);
Colin M. Hessel, Spruce Grove (CA);
Brian A. Korgel, Round Rock, TX (US)

(73) Assignee: Merck Patent GmbH, Darmstadt (DE)

( * ) Notice: Subject to any disclaimer, the term of this patent is extended or adjusted under 35 U.S.C. 154(b) by 143 days.

(21) Appl. No.: 13/259,602

(22) PCT Filed: Apr. 14, 2010

(86) PCT No.: PCT/US2010/030990
§ 371 (c)(1),
(2), (4) Date: Sep. 23, 2011

(87) PCT Pub. No.: WO2010/120849
PCT Pub. Date: Oct. 21, 2010

(65) Prior Publication Data
US 2012/0077034 A1    Mar. 29, 2012

Related U.S. Application Data

(60) Provisional application No. 61/170,063, filed on Apr. 16, 2009.

(51) Int. Cl.
*B82Y 40/00* (2011.01)
*B82Y 30/00* (2011.01)
*C30B 7/00* (2006.01)
*C30B 7/14* (2006.01)
*C30B 29/06* (2006.01)
*C30B 29/60* (2006.01)
*C30B 7/06* (2006.01)

(52) U.S. Cl.
CPC ............... *C30B 29/06* (2013.01); *B82Y 30/00* (2013.01); *C30B 7/00* (2013.01); *B82Y 40/00* (2013.01); *C30B 7/06* (2013.01); *C30B 7/14* (2013.01); *C30B 29/60* (2013.01); *Y10S 977/896* (2013.01); *Y10S 977/762* (2013.01)
USPC ............... 117/87; 117/75; 117/931; 428/401; 423/349; 977/896; 977/762

(58) Field of Classification Search
CPC ............ C30B 29/06; C30B 29/60; C30B 7/14
USPC ........................................................... 117/87
See application file for complete search history.

(56) References Cited

U.S. PATENT DOCUMENTS 7,160,525 B1 *  1/2007 Peng et al. ................. 423/1
2002/0175408 A1 * 11/2002 Majumdar et al. ............ 257/734

(Continued)

OTHER PUBLICATIONS

Solution-Liquid-Solid (SLS) Growth of Silicon Nanowires, Andrew T. Heitsch, Dayne D. Fanfair, Hsing-Yu Tuan, and Brian A. Korgel, J. Am. Chem. Soc. 2008, 130, 5436-5437.*

(Continued)

*Primary Examiner* — Michael Kornakov
*Assistant Examiner* — Hua Qi
(74) *Attorney, Agent, or Firm* — John A. Fortkort; Fortkort & Houston P.C.

(57) ABSTRACT

A method for making silicon nanorods is provided. In accordance with the method, Au nanocrystals are reacted with a silane in a liquid medium to form nanorods, wherein each of said nanorods has an average diameter within the range of about 1.2 nm to about 10 nm and has a length within the range of about 1 nm to about 100 nm.

30 Claims, 24 Drawing Sheets

(56) References Cited

U.S. PATENT DOCUMENTS

| | | |
|---|---|---|
| 2005/0029678 A1 | 2/2005 | Hanrath et al. |
| 2008/0041814 A1* | 2/2008 | Romano et al. ................ 216/13 |
| 2008/0089836 A1 | 4/2008 | Hainfeld |
| 2011/0033969 A1† | 2/2011 | Chaudhari |

OTHER PUBLICATIONS

Controlled growth of silicon nanowires, Y.Y. Wong, M. Yahaya, M. Mat Salleh, B. Yeop Majlis, Nanotechnology II, Proceedings of SPIE vol. 5838 (SPIE, Bellingham, WA, 2005), 285-292.*

Heitsch, Andrew et al.; "Solution-Liquid-Solid (SLS) Growth of Silicon Nanowires"; Journal of the American Chemical Society; vol. 130, No. 16; Apr. 1, 2008; pp. 5436-5437.

Hessel, Colin M. et al.; "Gold Seed Removal from the Tips of Silicon Nanorods"; NANO Letters; vol. 10, No. 1; Jan. 13, 2010; pp. 176-180.

Heitsch, Andrew T. et al., "Colloidal Silicon Nanorod Synthesis"; NANO Letters; vol. 9, No. 8; Aug. 12, 2009; pp. 3042-3047.

Supplementary European Search Report; corresponding European patent application No. 10 765 063.2; dated Sep. 12, 2012; 5 pages.

* cited by examiner
† cited by third party

SYNTHESIS OF SILICON NANORODS

CROSS-REFERENCE TO RELATED APPLICATIONS

The present application claims priority from PCT/US10/30990, filed on Apr. 14, 2010, having the same inventors and the same title, which is incorporated herein by reference in its entirety, and which claims priority to U.S. Ser. No. 61/170,063, filed on Apr. 16, 2009, which is entitled "Synthesis of Silicon Nanorods", and which is also incorporated herein by reference in its entirety.

FIELD OF THE DISCLOSURE

The present disclosure relates generally to nanoparticles, and more particularly to the solution-based synthesis of silicon nanorods.

BACKGROUND OF THE DISCLOSURE

Porous silicon and silicon nanocrystals (or quantum dots) have received considerable interest in the art. These materials exhibit unique physical properties, including the efficient, size-tunable emission of visible light that may be harnessed in a variety of applications. Such applications include their use in Si-based light-emitting diodes (LEDs), in the optical integration of integrated circuits, and as biological imaging contrast agents. Si nanocrystals also exhibit increased photoconductivity when illuminated, and thus may be integrated into the next generation of low cost solar cells.

Nanorods may be distinguished from other nanocrystals by their aspect ratios (the ratio of their length to their width). Thus, by definition, nanorods have aspect ratios that range from greater than 1 up to about 100. By contrast, nanowires have aspect ratios of 100 or greater, and thus may be "infinitely" long. Semiconductor nanorods are anisotropic nanocrystals which may have faceted surfaces, and which may be cylindrical or ellipsoidal in shape.

When the dimensions of semiconductor nanocrystals are of the order of the Bohr exciton diameter or the de Broglie wavelength of an electron or hole, many of the optical, electronic and physical properties of the nanocrystals become size-dependent. Consequently, semiconductor nanocrystals may exhibit electronic and optical properties that depend on both their thickness and length. By contrast, the corresponding optical and electronic properties of spherical nanocrystals and nanowires are typically determined by a single dimension (their diameter).

Many of the electronic and optical properties of nanorods lie somewhere in between those of spherical nanocrystals and nanowires. Thus, for example, FIG. 15 depicts the slope relationships for the size dependence (where d is thickness or diameter) of the effective band gaps ($\Delta E_G S$) in quantum wells QWs, QRs, and QDs composed of the same semiconductor material, as predicted by simple EMA-PIB models. The slope ratios are determined to be $A_{well}/A_{wire}/A_{dot}=1:00:2.34:4.00$. As seen therein, the nanorod zone is bounded by the zones for spherical nanocrystals and nanowires.

Semiconductor nanorods may also be distinguished from spherical nanocrystals and from nanowires by other properties, including their polarization of light. Such polarization may depend on both the length and width of the nanorods. Nanorods may also emit highly polarized light and may exhibit large permanent dipole moments. Nanorods may also exhibit other properties that differ fundamentally from spherical nanocrystals, such as their excitonic fine structure and excited state lifetimes. Nanorods may also be more suitable than other types of nanocrystals for certain applications, such as their use in lasers, which require optical gain and spontaneous emission.

Relative to nanowires, nanorods may also be more processable. By way of example, nanorods may be printed with inkjet devices, whereas nanowires are typically too long to fit through the orifices of inkjet printers. Nanorods may be produced as colloidal dispersions or mixed with polymers to form compositions which exhibit good flow properties, whereas nanowires become tangled and do not flow easily. Like spherical nanocrystals, nanorods may be dispersed easily, but exhibit unique optical and electronic properties compared to spherical nanocrystals. As with liquid crystals, nanorods may also be oriented in concentrated dispersions, with their long axes preferably aligned. This kind of orientation may be utilized in the production of optical polarization filters or fluorescent films which exhibit polarized light emission.

Monodisperse nanocrystals of many different kinds of semiconductor materials may be effectively obtained, in significant quantities, through solution-based chemical synthesis. By way of example, vapor-liquid-solid (VLS), solution-liquid-solid (SLS), and supercritical fluid-liquid-solid (SFLS) processes have been developed in the art which may be used to produce crystalline nanowires having very high aspect ratios and few crystallographic defects. Notably, all of these processes rely on the use of metal seed particles to induce the growth of semiconductor nanowires. In some cases, the synthesis allows the shape of the nanocrystals to be somewhat tunable, thus providing some control over the properties of the resulting material.

The solution-based synthesis of silicon nanocrystals, however, is very challenging, due to the relatively high crystallization energy barrier of silicon and its complicated reaction and surface chemistry. Existing methods for making silicon nanocrystals provide limited control over the dimensions of the resulting nanocrystals. Indeed, to date, colloidal Si nanorods have never been produced.

There are many examples in the literature of Si nanocrystal synthesis in solution by arrested precipitation. However, most of these methods are challenged by low yields, as the crystallization temperature for Si is relatively high and the reactions are limited by the boiling temperatures of the solvents. Solution-dispersible, quantum-size Si nanocrystals approximately 5 nm or less may also be obtained by "two-step" synthetic routes, such as plasma-assisted growth, gas or laser pyrolysis, liberation of nanocrystals by etching silicon-embedded oxides, and ultrasonication of porous Si, followed by nanocrystal capture (and often passivation) in a solvent. These methods provide effective routes to solution-dispersible Si quantum dots, but do not provide obvious methods for controlling the Si nanocrystal shape.

In contrast to these two-step methods, direct synthesis in solution has proven to be an effective method for obtaining significant quantities of nanorods and nanowires of many different semiconductors via processes such as ligand-assisted growth, oriented attachment, and nanocrystal-seeded growth. Si nanowires have been synthesized in solution, in high boiling solvents by solution-liquid-solid (SLS) growth and in high pressure, hot supercritical fluids by supercritical fluid-liquid-solid (SFLS) growth. Both of these processes rely on the use of metal nanocrystals as seeds to promote nanowire growth. Si nanowires grown by vapor-liquid-solid (VLS) methods have been integrated into single wire FETs, and the optical and electronic properties of quantum size Si nanowires have been characterized. As indicated above, however, to date, Si nanorods have not been made by a solution-based synthetic process.

BRIEF DESCRIPTION OF THE DRAWINGS

FIG. 17A is a TEM of Si nanorods with more than 95% removal of the Au tips; the inset is a photograph of the Si nanorods partitioned to the chloroform/water interface after Au etching.

FIGS. 17B-I are magnified images of the hollow Si shells at the tips of most nanorods.

FIG. 17J is a high-angle annular dark field (HAADF) scanning TEM image of a few nanorods after etching.

FIG. 17K is a high-resolution TEM image of an etched Si nanorod. The nanorod is crystalline with a lattice spacing of 3.1 Å, corresponding to the (111) d-spacing of diamond cubic silicon. The circular outline indicates the location of the Au seed prior to etching.

SUMMARY OF THE DISCLOSURE

Figure 1:
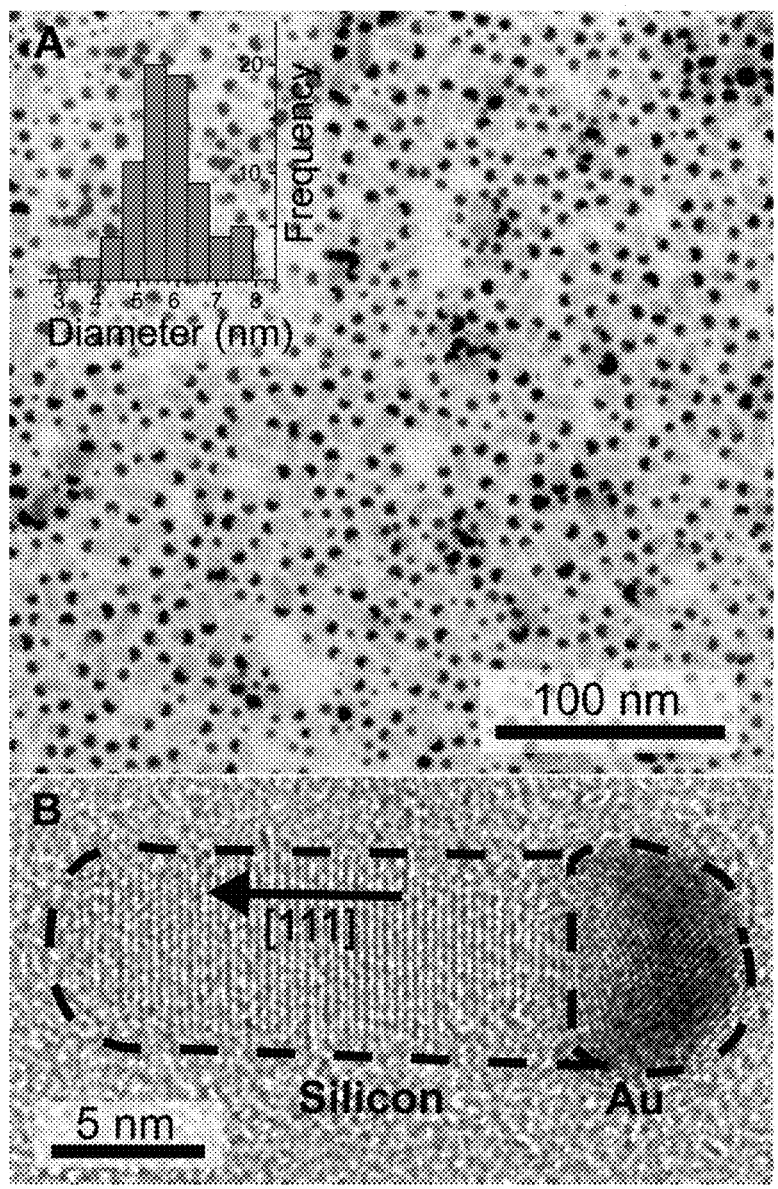
FIGS. 1A-1B are TEM images of Si nanorods.
Figure 2:
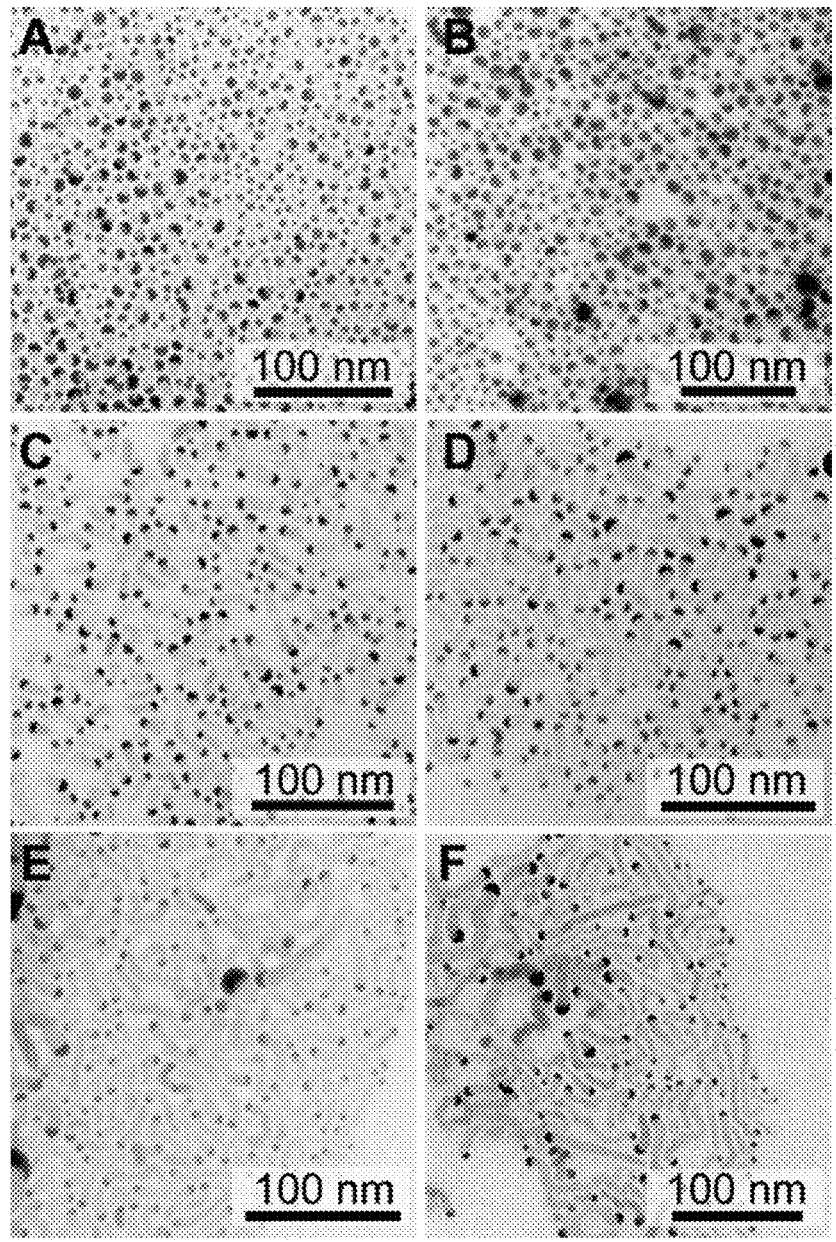
FIGS. 2A-2F are TEM images of Si nanorods of varying length and aspect ratios.

In one aspect, a method for making silicon nanorods is provided herein. In accordance with the method, nanorods are formed by reacting Au nanocrystals with a silane in a liquid medium, and preferably in the presence of a coordinating ligand which is preferably a primary amine. Each of the nanorods has an average diameter within the range of about 1.2 nm to about 10 nm and has a length within the range of about 1 nm to about 100 nm.

In another aspect, a method for making silicon nanorods is provided herein. The method comprises (a) forming a first mixture by mixing $Si_3H_8$ with Au nanocrystals disposed in a first liquid medium; (b) heating, to a temperature above 340° C., a second mixture comprising a primary amine (preferably dodecylamine) and at least one material selected from the group consisting of trioctylamine, squalane and octacosane; and (c) adding the first mixture to the second mixture.

In a further aspect, a composition is provided herein which comprises a plurality of silicon nanorods, wherein each of said plurality of nanorods has an average diameter within the range of about 1.2 nm to about 10 nm, and has a length within the range of about 1 nm to 100 nm.

In still another aspect, a method is provided herein for making nanostructures (such as nanorods or nanowires) of a desired length. The method comprises (a) determining a desired length for the nanostructures, and (b) reacting a seed material (such as Au nanocrystals) with a precursor (such as a silane or germane) in a liquid medium to produce the nanostructures. The molar ratio of precursor to seed material is selected to achieve the desired nanostructure length. Each of the nanostructures preferably has an average diameter within the range of about 1.2 nm to about 10 nm.

In another aspect, a method is provided herein for making silicon nanorods of a desired length. The method comprises (a) determining a desired length for the silicon nanorods, and (b) reacting Au nanocrystals with a silane in a liquid medium to produce the nanorods. The molar ratio of silane to Au nanocrystals is selected to achieve the desired nanorod length, and each of the nanorods has an average diameter within the range of about 1.2 nm to about 10 nm and a length within the range of about 1 nm to about 100 nm.

In yet another aspect, a method is provided for forming nanostructures, especially nanorods and nanowires. The method comprises (a) heating a mixture of a Group IV metal organometallic precursor and metal nanocrystals in a liquid medium at a temperature wherein the precursor decomposes and nanostructures grow from the metal nanocrystals; (b) rapidly cooling the liquid medium; and (c) subjecting the nanostructures to an etch to remove the material of the metal nanocrystals therefrom.

DETAILED DESCRIPTION

It has now been found that semiconductor nanorods—including silicon nanorods—may be produced through the methodologies described herein, which provide for the solution-based synthesis of crystalline nanorods via an arrested solution-liquid-solid (SLS) growth process. In a preferred embodiment of this methodology, a suitable precursor (which, in the synthesis of silicon nanorods, is preferably a silane, and more preferably trisilane ($Si_3H_8$)) is decomposed in a high boiling solvent (which preferably comprises trioctylamine, squalane, or octacosane) which is preferably heated above 375° C. in the presence of seed crystals (preferably colloidal gold nanocrystals) and a coordinating ligand (preferably a primary amine, and more preferably dodecylamine). Under proper conditions, the precursor decomposes to form nanorods. Thus, for example, in the synthesis of silicon nanorods (and without wishing to be bound by theory), the silane decomposes to form elemental Si, the seed crystals induce crystallization of the Si into nanorods, and the coordinating ligand provides steric stabilization of the seed crystals and Si nanorods.

It has also been found that this process may be used to preferentially produce nanostructures, and especially nanorods and nanowires, of a desired length and diameter. In particular, it has been found that the size of the seed crystals may be used as a reaction parameter to manipulate the nanostructure diameter, while the ratio of seed material and precursor (for example, the Au:Si ratio when gold nanocrystals and a silicon precursor are utilized) may be utilized as a reaction parameter to manipulate nanostructure length.

It has further been found that thermal quenching may be used to enhance the removal of seed crystal material in a subsequent etching process for nanorods made in accordance with the foregoing methodology. Indeed, this methodology may be utilized to remove metal seed materials from nanocrystals (including nanorods and nanowires) of various compositions that are made in accordance with various types of processes.

Thus, as noted above, vapor-liquid-solid (VLS), solution-liquid-solid (SLS), and supercritical fluid-liquid-solid (SFLS) processes rely on the use of metal seed particles to induce the growth of semiconductor nanowires. These approaches yield crystalline nanowires with very high aspect ratios and few crystallographic defects. However, the metal seeds remain attached to the ends of the nanowires, which can be problematic, particularly when gold (Au)—the most common seed metal for silicon (Si) nanowires—is used. Au forms a deep trap level in Si that can seriously deteriorate the performance of electronic and optoelectronic devices such as transistors, optical detectors, and photovoltaics. Au can also quench light emission, as observed for Si nanowires grown with Au seeds, CdSe nanorods decorated with Au nanocrystals, and Si nanocrystal thin films implanted with Au. Accordingly, it would be desirable to remove the Au tips from the nanowires grown by these processes.

However, due to a variety of factors, chemical removal of the metal seeds from the tips of Si nanowires and nanorods is very challenging. First of all, the etching must be selective for Au and must not damage or degrade the nanostructures. However, due to the well-known inertness of gold, most common Au etchant solutions are highly oxidative, and hence their use can result in damage to nanostructures. For example, when Au seed etching from Ge nanowires is performed with aqueous triiodide ($I^-:I_2:I_3^-$) solutions, the triiodide removes Au, but also significantly degrades the nanowires.

Secondly, Au etching may be uneven throughout the sample, with the result that some of the gold seed material is not removed from portions of the sample, while other portions of the sample are overetched. Depending on the selectivity of the etch, such overetching can damage the nanostructures. This problem may be further exacerbated by the wettability of the nanostructure surface, which can range from hydrophilic to hydrophobic depending on how the nanostructures are modified after synthesis. Finally, even after prolonged etching, the gold seed material may be removed incompletely from some of the nanostructures.

It has now been found that the solution-based synthesis of nanostructures, including nanowires and nanorods, can result in the formation of a shell of the nanostructure material that surrounds each Au seed and prevents access thereto of the chemical etchant. The existence of this shell, and its importance to metal seed removal, has not previously been recognized in the art. It has further been found, as noted above, that this shell may be sufficiently degraded to allow etching of the underlying seed material by subjecting a heated solution containing seeded nanocrystals to a rapid thermal quench. Without wishing to be bound by theory, it is believed that a rapid thermal quench ruptures the shell, possibly as a result of the interfacial strain arising from the significant difference between the linear expansion coefficients of Au and Si, thus exposing the encapsulated seed material to the etchant.

The practice of this methodology in conjunction with the Au-seeded process disclosed herein for synthesizing silicon nanorods is especially advantageous, because the nanorods may be formed by this process as a uniformly dispersed colloid. Hence, subsequent to the rapid thermal quench, the Au seed material may be removed with aqua regia or another suitable etchant. During this etching process, the uniformly dispersed nature of the colloid will ensure even etching. By contrast, the treatment of non-uniformly dispersed nanostructures can result in uneven or incomplete etching. Moreover, the Au etching efficacy of a colloidal dispersion of Si nanorods may be readily determined with a high degree of statistical accuracy using transmission electron microscopy (TEM), which thus allows for the development of efficient and effective etching procedures and provides an effective tool for monitoring the etching process.

The methodologies and compositions disclosed herein, and the characterization of these compositions and their attributes by a variety of analytical techniques, will now be illustrated with respect to the following particular, non-limiting examples.

Materials

The following materials were used in the examples set forth herein.

Octacosane (99%), squalane (99%), trioctylphosphine (90%), anhydrous benzene (99.8%), dodecylamine (98%), dodecene (≥99.0%), tridodecylamine (85%), dodecanethiol (≥98%), gold tetrachloroaurate trihydrate (99.9+%), sodium borohydride (98+%), toluene (99.8%), dodecanethiol (≥98%), methanol (99.9%), chloroform (99.9%), triocytlammonium bromide (TOAB, 98%), anhydrous toluene (99.8%), anhydrous ethanol (≥99.5% denatured), anhydrous chloroform stabilized by pentenes (99%) and benchtop chloroform (ACS grade) were purchased from Sigma-Aldrich (St. Louis, Mo.). Trioctylamine (>99.0%) and dodecene (>98%) was purchased from Fluka Analytical (St. Louis, Mo.). Nitric acid (99.9%) and hydrochloric acid (99.9%) were purchased from Fisher Scientific (Waltham, Mass.). Trisilane (99.99%) was purchased from Voltaix, LLC (North Branch, N.J.) and should be used with caution as it is a pyrophoric liquid with high vapor pressure. All chemical were used as received except for squalane, which was further purified by three freeze-pump-thaw cycles under reduced pressure (400 mTorr). Triply distilled deionized water (DI-$H_2O$) filtered with an 18.2 MΩ-cm resistance Barnstead E-pure unit was used for all aqueous preparations.

Sample Preparation and Characterization

The following procedures were used to prepare and characterize samples made in the following examples, where indicated.

Transmission electron microscopy (TEM) samples were prepared by dropcasting 5 µL of dilute chloroform or toluene solutions containing Si nanorods onto 200 mesh carbon coated copper TEM grids (Electron Microscopy Sciences). Low resolution TEM images were acquired digitally on a Phillips EM208 TEM with 80 kV accelerating voltage and an AMT Advantage HR 1 MB digital camera. A JEOL 2010F high resolution TEM operated at 200 kV was used to resolve lattice fringes of the Si nanorods.

X-ray diffraction (XRD) of dried Si nanorods on quartz substrates were acquired on a Bruker-Nonius D8 Advance diffractometer. Scans of 2θ° from 10-90 in 0.02 (2θ°) increments with a scan rate of 12.0°/minute were continuously averaged for 12 hours.

XPS (x-ray photoelectron spectroscopy) was performed on a Kratos photoelectron spectrometer equipped with a charge neutralizer and 180° hemispherical electron energy analyzer. For XPS, samples were dropcast on Si substrates coated with 30 nm of Ti and degassed at pressures below $10^{-7}$ torr by diffusion pump for 2 days. Exposure of the nanorods to air during the work up was minimized to less than 3 minutes. The XPS data was internally standardized with respect to the Au4f7/2 and Au4f5/2 peak positions.

Fourier transform infrared (FTIR) spectra (400-4000 $cm^{-1}$) of Si nanorods were acquired using a Thermo Mattson Infinity Gold FTIR with an attenuated total internal reflectance (ATR) stage.

EXAMPLE 1

This example illustrates one particular, non-limiting embodiment of a method for preparing Au seed nanocrystals suitable for use in the methodologies described herein.

Samples of 2 nm diameter dodecanethiol-coated Au nanocrystals were synthesized according to a modified version of the method described in Alivisatos, A. P. *Science* 1996, 271, 933-937. Pursuant to the modified method, 2.188 g (4 mmol) of trioctylammonium bromide (TOAB) was dissolved in 80 mL of toluene in a 125 mL Erlenmeyer flask. In a separate Erlenmeyer flask, 305.8 mg (0.77 mmol) of tetrachloroaurate trihydrate was dissolved into 30 mL of DI-$H_2O$. The TOAB solution was placed on a stir plate and a ¾ inch (1.9 cm) cylindrical TEFLON® PTFE stir bar was added to the Erlenmeyer flask. The solution was stirred moderately at a rate of 600 RPM.

The aqueous tetrachloroaurate solution was mixed with the organic TOAB solution and an emulsion was formed. After 1 hour, the mixture was poured into a 250 mL separatory funnel, and the aqueous and organic phases separated within 1 minute. The organic layer was collected in a clean 125 mL Erlenmeyer flask. The aqueous layer was discarded. The toluene solution containing gold chloride ions was placed back on the stir plate and stirred moderately, after which 0.201 mL (0.84 mmol) of dodecanethiol was injected into the gold chloride solution and stirred for 5 minutes.

In a 50 mL Erlenmeyer flask, 378.0 mg (10 mmol) of sodium borohydride was dissolved in 25 mL of deionized $H_2O$, and the resulting solution was slowly added to the gold chloride solution. The solution immediately turned dark red/purple/black, indicative of the formation of 2 nm Au nanocrystals. This mixture was stirred for 3 hours and then poured into a 250 mL separatory funnel, were the organic and aqueous phases separated. The aqueous phase was discarded, and the Au nanocrystal solution was collected in 3-50 mL centrifuge tubes for cleanup. The as-prepared Au nanocrystal solution was initially centrifuged at 8,000 RPM (8228 g RCF) for 5 minutes at room temperature to rid the suspension of any large or uncapped nanocrystals. Typically, no nanocrystals were collected during this step. Then, 20 mL of methanol was added to each of the centrifuge tubes, and the solutions where centrifuged at 10,000 RPM (12857 g RCF) for 5 minutes at 10° C. The Au nanocrystals precipitated from solution and collected as a pellet on the sidewall of the centrifuge tube. The supernatant was discarded.

The Au nanocrystals were redispersed in 5 mL of chloroform and collected in one centrifuge tube. Then, 10 mL of methanol was added, and the solution was centrifuged again at 10000 RPM for 5 minutes at 10° C. The supernatant, which was colorless and translucent, was discarded. The Au nanocrystals were redispersed in 1 mL of chloroform, and were transferred to a glass vial. This specific recipe synthesizes about 150 mg of 2 nm diameter Au nanocrystals. The chloroform was evaporated from the Au nanocrystals using a rotary evaporator. Typically, stock solutions containing 300 mg of Au nanocrystals dispersed in dodecylamine (or another solvent) were prepared and stored in a glovebox under $N_2$, prior to the silicon (Si) nanorod experiments.

EXAMPLE 2

This example illustrates one particular, non-limiting embodiment of the methodologies for synthesizing silicon nanorods in accordance with the teachings herein.

In preparation for the synthesis of silicon nanorods, all Schlenk line glassware to be used in the synthesis was cleaned in a standard potassium hydroxide-isopropyl alcohol base bath and subsequently washed with nitric acid, before being rinsed with deionized $H_2O$ and then dried with compressed air. The glassware was transferred into a MBraun Unilab glovebox (<0.1 ppm $O_2$) containing a standard greaseless Schlenk line. Such precautions were necessary to insure the safe usage of trisilane (a pyrophoric liquid), and to prevent oxygen or other contaminates from affecting the synthesis.

In a typical implementation of the methodology, a glass stir bar and 8 mL of a high boiling point solvent (such as octacosane [b.p. 430° C.], squalane [b.p. 420° C.], trioctylamine [b.p. 380° C.], or trioctylphosphine [b.p. 380° C.]) was added to a 50 mL, four-neck flask fitted with a condenser and stopcock valve. The sealed vessel was attached to the Schlenk manifold and was kept isolated from the glovebox atmosphere at all times during synthesis. The reaction temperature was controlled with an Omega CN76000 autotune feedback temperature controller in combination with a 120 Watt (Star Energy Co.) Variac and aluminum thermocouple (k type, obtained from Omega Engineering Inc., Stamford, Conn.). The high boiling point solvent was heated to 110° C. and was degassed under vacuum for 30 minutes while stirring moderately (600 RPM). After degassing, the reaction vessel was purged with $N_2$ and remained under dynamic gas flow (1 psig) as the solvent was heated between 360° C. to 430° C., depending on the reaction conditions and solvent.

The reactant solution was prepared in the glovebox. Stock solutions of Au nanocrystals dispersed in dodecylamine with concentrations of 109 mg/mL, 54 mg/mL, or 36 mg/mL were used in the synthesis, although stock solution of Au nanocrystals dispersed in dodecanethiol, tridodecylamine, anhydrous benzene, or dodecene were also explored in the synthesis. In a 3 mL glass vial, 0.125 mL (1.0 mmol) of trisilane, 0.275 mL of the Au nanocrystal stock solution and 0.05 mL of the solvent that was used to disperse the Au nanocrystals were mixed to form the reactant solution. The Si:Au ratio was varied by changing the concentrations of Au nanocrystal stock solution and keeping the volumetric amounts of trisilane and Au nanocrystal stock solution constant at 0.125 mL and 0.275 mL, respectively.

Once mixed, 0.4 mL of the reactant solution was drawn into a disposable syringe and equipped with a 6 inch (15.24 cm) needle (20.5 G). Immediately prior to injection, the stopcock valve was closed to isolate the reaction vessel and to create a blanket of $N_2$. The reaction solution was then quickly injected through a septum into the hot solvent, making sure that the needle tip was completely submerged in the solvent prior to injection. Immediately after injection, the heating mantle was removed and the stopcock valve was re-opened to allow continuous $N_2$ flow while the solution cooled to room temperature.

To prevent Si nanorod exposure to the atmosphere, the reaction solution was collected in a 50 mL centrifuge tube and sealed in the glovebox before purification began. Typically, the centrifuging was conducted outside the glovebox, but the products were immediately brought back into the glovebox before cracking the seal of the cap and collecting the precipitated product. It should be noted that the $O_2$ level in the glovebox never rose above 0.1 ppm when the seal was cracked, indicating that no air was transferred into the headspace of the centrifuge tube during centrifugation.

When octacosane was used as the solvent, 10 mL of anhydrous toluene was injected into the flask when the solution cooled to 60° C. in order to prevent the solvent from solidifying. This solution was transferred to a 50 mL centrifuge tube and centrifuged for 1 minute at 8000 rpm (8228 g RCF) and a slightly elevated temperature (about 35° C.). A brownish/black precipitate remained on the sides of the centrifuge tube after centrifugation. The supernatant was discarded. The precipitate was redispersed in 5 mL of anhydrous toluene, heated to 35° C. and centrifuged again at 8000 rpm for 1 minute. The supernatant was again discarded.

When squalane, trioctylamine, or trioctylphosphine were used as solvents, only 5 mL of anhydrous toluene was added to collect the product. Additionally, the product was centrifuged for 5 minutes at 10° C., as opposed to 1 minute at 35° C.

After the initial separation process, the Si nanorod products were cleaned in exactly the same manner. The Si nanorods were redispersed in 3 mL of anhydrous toluene. Then, 3 mL of anhydrous ethanol was added, and the solution was centrifuged for 5 minutes at 10000 rpm (12857 g RCF) and 10° C. This process was repeated twice until the supernatant was clear, colorless and transparent. Finally, the Si nanorods were redispersed in 3 mL of anhydrous chloroform and were stored under $N_2$ until further use. A typical synthesis yields 10 mg of Si nanorods with about 8% conversion of trisilane.

Figure 9:
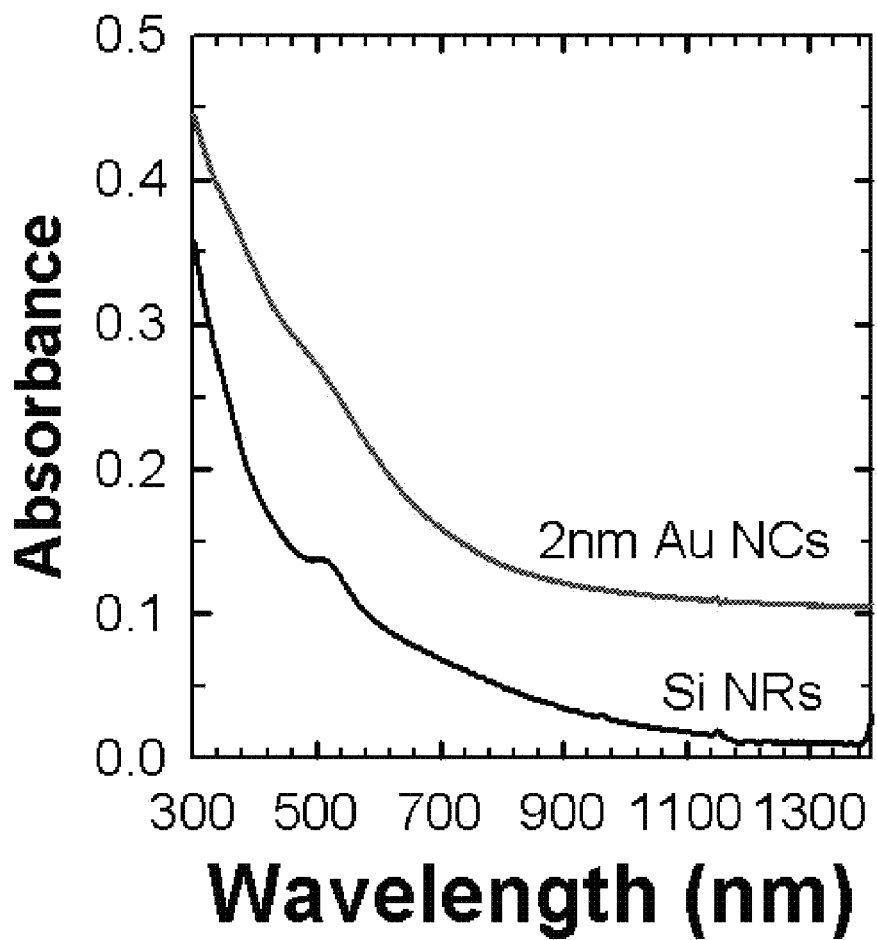
FIG. 9 is a UV-visible absorbance spectrum of a chloroform dispersion of Si nanorods with Au nanocrystal seeds located at the tip.

FIG. 9 shows UV-visible absorbance spectra of a chloroform dispersion of Si nanorods with Au nanocrystal seeds located at the tip. For reference, the 2 nm nanocrystals seeds in chloroform are also plotted on the same graph the Si nanorods. As seen therein, the spectra is dominated by the Au seed absorbance, with a surface plasmon resonance at 530 nm.

In the process described in EXAMPLE 2, Si is produced by thermal decomposition of the trisilane. Without wishing to be bound by theory, it is believed that, because the reaction temperature exceeds the Au:Si eutectic temperature of 363° C., Si atoms produced by the decomposition reaction dissolve in the Au nanocrystals to form a Au:Si melt and that, when the Si concentration in the Au seed exceeds the liquidus composition, solid Si nucleates and forms a Si nanorod. Further discussion of the SLS growth process may be found in Heitsch, A. T.; Fanfair, D. D.; Tuan, H. Y.; Korgel, B. A. *JACS* 2008, 130, 5436-+ and in Wang, F. D.; Dong, A. G.; Sun, J. W., and Tang, R.; Yu, H.; Buhro, W. E. *Inorg. Chem.* 2006, 45, 7511-7521, both of which are incorporated herein by reference in their entirety.

Again without wishing to be bound by theory, it is believed that the coordinating ligand, which is preferably a primary amine, stabilizes the nanorods that form through this SLS process by bonding to both the Au and Si surfaces to provide a steric barrier to aggregation. The nanorod diameter closely matches the Au seed diameter, thus demonstrating that appropriate selection of seed crystal size may be utilized to manipulate the diameter of the resulting nanorods. It has also been found that the nanorod length may be adjusted by tuning the molar ratio Si:Au of the reaction chamber. Thus, for example, longer nanorods may be grown by increasing the amount of Si relative to Au in the reaction chamber. This feature of the methodologies disclosed herein is explored in greater detail in EXAMPLES 8 and 9 below.

EXAMPLE 3

This example illustrates one particular, non-limiting embodiment of a method (in this case involving the use of an aqua regia microemulsion) for removing seed material (in this case, Au) from the tip of nanostructures (in this case, Si nanorods) made in accordance with the methodologies disclosed herein.

In a typical implementation of the process, 3 mg of Si nanorods were added to 10 mL of chloroform in a TEFLON® beaker. Then, 10 mL of aqua regia (1 part $HNO_3$: 3 parts HCl) was added to the Si nanorod dispersion to form a biphasic mixture of a denser chloroform-rich phase and an aqua regia layer. The majority of the nanorods partitioned to the solvent/solvent interface. An emulsion was induced by rapidly stirring the mixture (at about 500 rpm), causing chloroform pockets to form in an aqua regia matrix. The mixture was stirred for 3 hours before allowing the emulsion to separate. The aqua regia layer was then extracted and discarded. The isolated chloroform layer was washed three times with 20 mL aliquots of DI-$H_2O$ to remove residual ions. The aqueous waste was discarded.

It should be noted the microemulsion etching method was sensitive to the Si nanorod loading. Optimal results were obtained when 3 mg of Si nanorods were combined with a biphasic mixture containing 20 mL of both chloroform and aqua regia. Increasing the nanorod loading resulted in permanent emulsions that hindered product recovery.

EXAMPLE 4

This example illustrates a further particular, non-limiting embodiment of a method (in this case involving the use of an aqua regia microemulsion) for removing seed material (in this case, Au) from the tip of nanostructures (in this case, Si nanorods) made in accordance with the methodologies disclosed herein.

Si nanorods were synthesized by an arrested SLS growth process of the type described in EXAMPLE 2. In accordance with this process, trisilane was decomposed in the presence of dodecanethiol-capped Au nanocrystals and dodecylamine in squalane at 420° C. Reactions were carried out at relatively high Au:Si molar ratios of 1:40. In the reaction, dodecylamine is used as a capping ligand to prevent aggregation of the Au seeds and Si nanorods.

Figure 16:
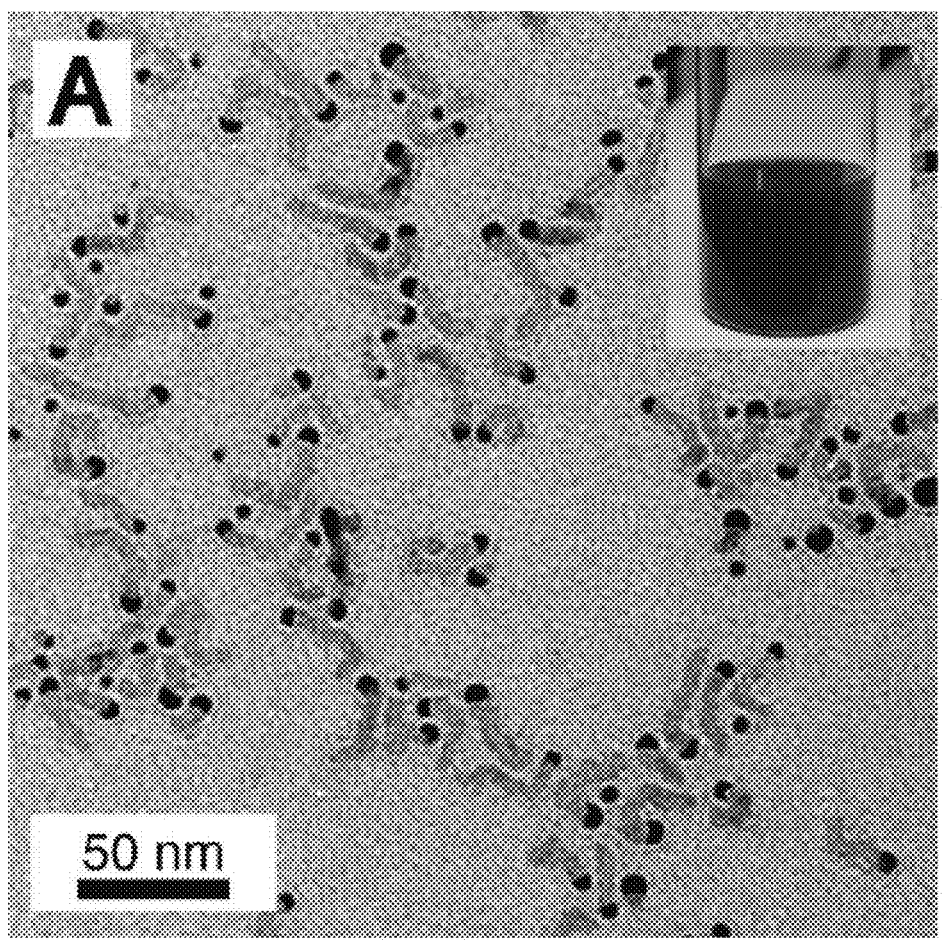
FIG. 16 is a TEM image of Si nanorods before Au etching; the inset is a photograph of a vial of Si nanorods dispersed in chloroform (1 mg/mL).

The nanorods formed by this process had an average length of 30 nm and a diameter of 7 nm, and had exactly one Au seed at the tip of each nanorod. The Au seeds were clearly evident in TEM images (see FIG. 16 for example), due to their much darker contrast compared to Si. The nanorods disperse readily in chloroform. The dispersion appeared predominantly dark brown with a purple hue that is characteristic of the Au seeds (see the photograph in the inset in FIG. 16).

Initial attempts to etch the Au seeds from the tips of the Si nanorods were largely unsuccessful. Thus, when the Si nanorod reaction mixture was allowed to cool gradually to room temperature, only about 15% of the Au tips were removed with a subsequent aqua regia etch. Without wishing to be bound by theory, this result is believed to be due to the presence of a thin shell of Si that coats each Au seed and prevents the etchant from reaching the Au core. With knowledge of its existence, the shell can be observed by very careful TEM imaging. However, it is otherwise difficult to recognize because it is only 5-8 Å thick and conformally and uniformly coats the Au surface.

It was found that the Au tips could be reliably and completely etched by preparing the nanorods with a rapid thermal quench of the reaction mixture with the injection of 3 mL of room temperature anhydrous toluene to the 5 mL of growth solution at the end of the reaction. The reaction temperature drops from 420° C. to below the eutectic temperature (363° C.) in less than 5 seconds after adding the toluene. This change in temperature is much faster than the cooling time of 48 seconds typically required to cover the same temperature range when the reaction is simply removed from the heating mantle.

Figure 8:
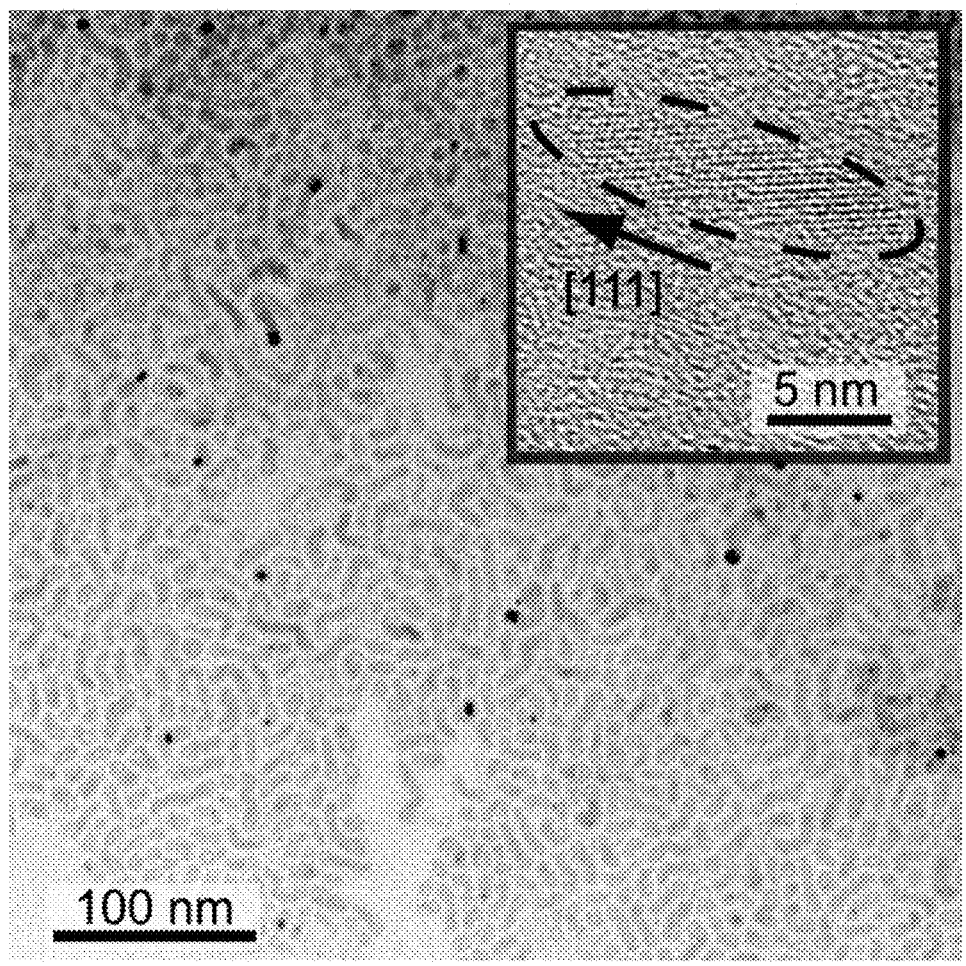
FIG. 8 is a TEM image of Si nanorods after etching the Au with an aqua regia solution; the inset shows a Si nanorod without an Au seed attached to the tip.
Figure 17:
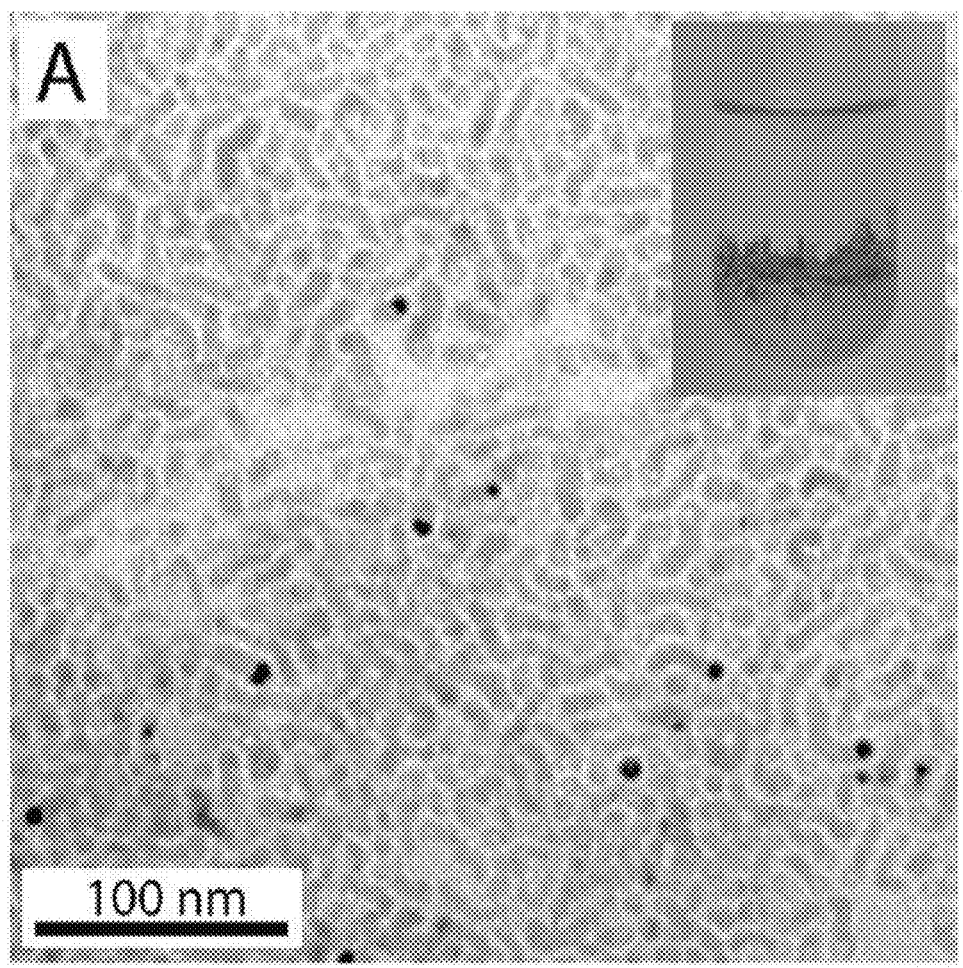
FIG. 17A-K are TEM images of thermally quenched Si nanorods after exposure to an aqua regia/chloroform emulsion for 24 hours.
Figure 17:
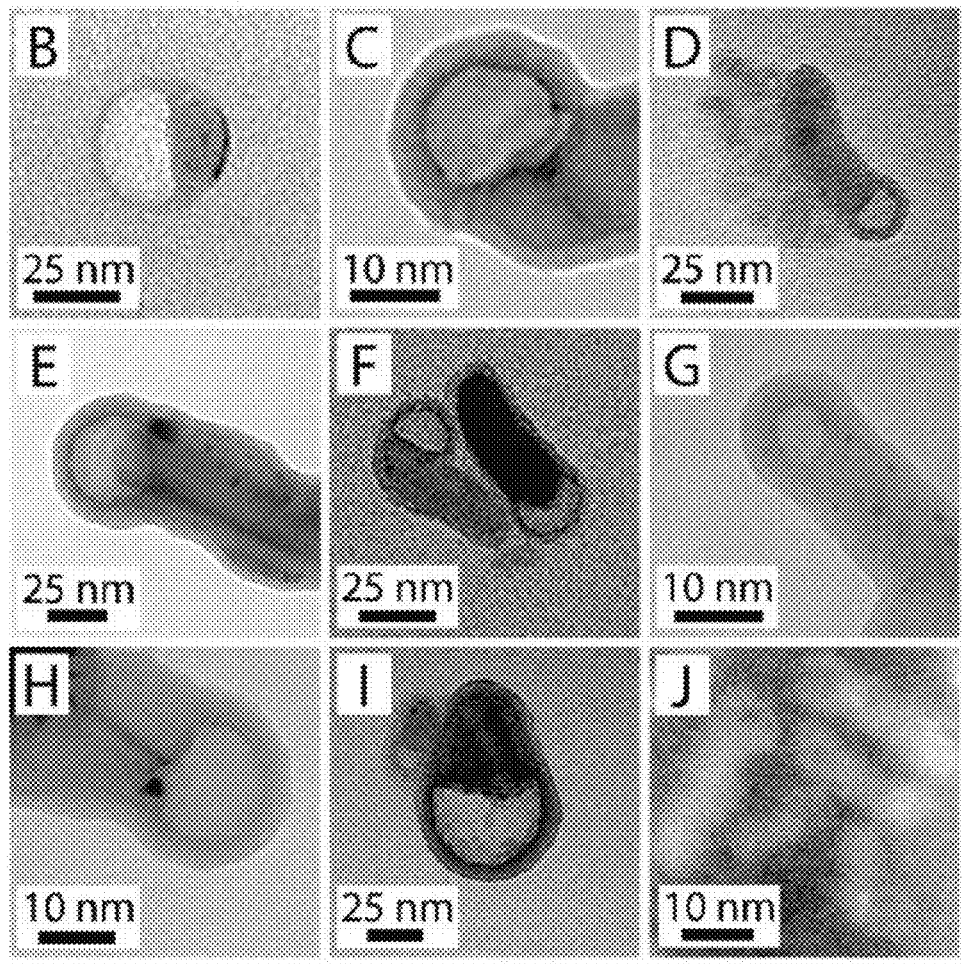
Figure 17:
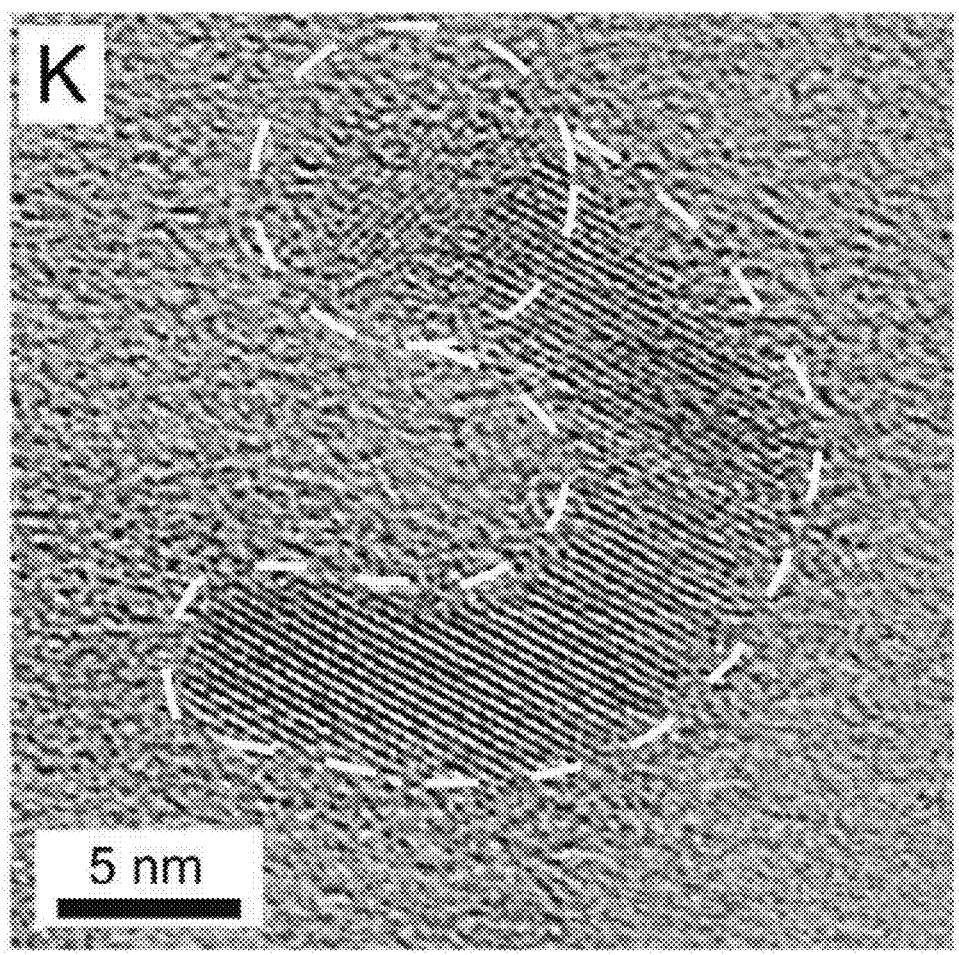

The quenching process appears to create defects in the Si shell that provide access for the etchant to penetrate the shell and remove the Au seed material. Thus, FIG. 8 is a TEM image of thermally quenched Si nanorods after etching the Au with an aqua regia etch solution (the inset shows the Si nanorods without its Au seed attached to the tip). About 90% removal of the Au seed tips was obtained by this method in the sample shown. FIG. 17 shows TEM images of thermally quenched Si nanorods with nearly 95% removal of the Au tips. A remnant shell is present at the tip of each nanorod.

The most effective etchant solution was found to be a mixture of 15 mL of aqua regia (1:3; 69% HNO3:37% HCl) and 15 mL of chloroform. Three milligrams of Si nanorods were dispersed in the chloroform phase, and the emulsion was stirred for 24 h at room temperature. The biphasic mixture of chloroform-dispersed nanorods and aqueous Au etchant solution (aqua regia) was necessary to disperse the hydrophobic nanorods. Triiodide and cyanide salts were also evaluated as etchants, but aqua regia was found to be the most effective.

Rapid stirring of the emulsion appears to be important, possibly because it increases interfacial contact between the organic and aqueous phases and facilitates the etching process. Within the first 5 minutes of mixing, the nanorods partition to the aqueous/organic interface and remain there throughout the course of the reaction.

EXAMPLE 5

This example illustrates the effect of etch timing on the removal of seed material.

Five 1-mL aliquots of the emulsion formed in EXAMPLE 4 were taken at 1.5, 3, 6, 12, and 24 hours after etching commenced. These aliquots were imaged by TEM to determine the extent of Au etching. In the first 1.5 h, the aqua regia was observed to have stripped the capping ligands and to have slightly oxidized the nanorod surface. After 3 h, 10% of the Au tips were removed. The etching efficacy increased with increased etching time. Thus, approximately 50, 80, and 95% of the Au tips were removed after 6, 12, and 24 h of etching, respectively.

The inset of FIG. 17A shows an image of the two-phase mixture 24 hours after the Au etching reaction commenced. At this point in the etching process, 95% of the seeds were removed. The color of the nanorods dispersion slowly changed from dark brown/purple to light brown over the 24 h reaction, and remained constant thereafter. The loss of the purple hue (characteristic of Au seeds) confirms that Au is indeed being removed from the nanorods. The light brown color is the expected color for Si nanostructures.

After etching, the nanorod product was washed three times with 10 mL each of chloroform and deionized water. The product was then collected from the organic/aqueous interface, dried, and redispersed before examination by TEM. Si nanorods isolated after etching were dispersible in polar solvents such as alcohols.

During the etching procedure, the aqua regia also oxidizes the Si shell around the Au seed, penetrating the defects formed during the thermal quench without disturbing the shell integrity and oxidizing the Si shell from both inside and outside. Although the entire nanorod surface is slightly oxidized during the etching process, the nanorods retain their crystallinity with nearly the same diameter as prior to etching. FIG. 17K shows a representative example of a crystalline Si nanorod after etching; the lattice fringes have a spacing of 3.1 Å, corresponding to the d-spacing between (111) planes in diamond cubic Si.

EXAMPLE 6

This example illustrates the changes in nanorods surface chemistry as a result of seed material etching.

Figure 18:
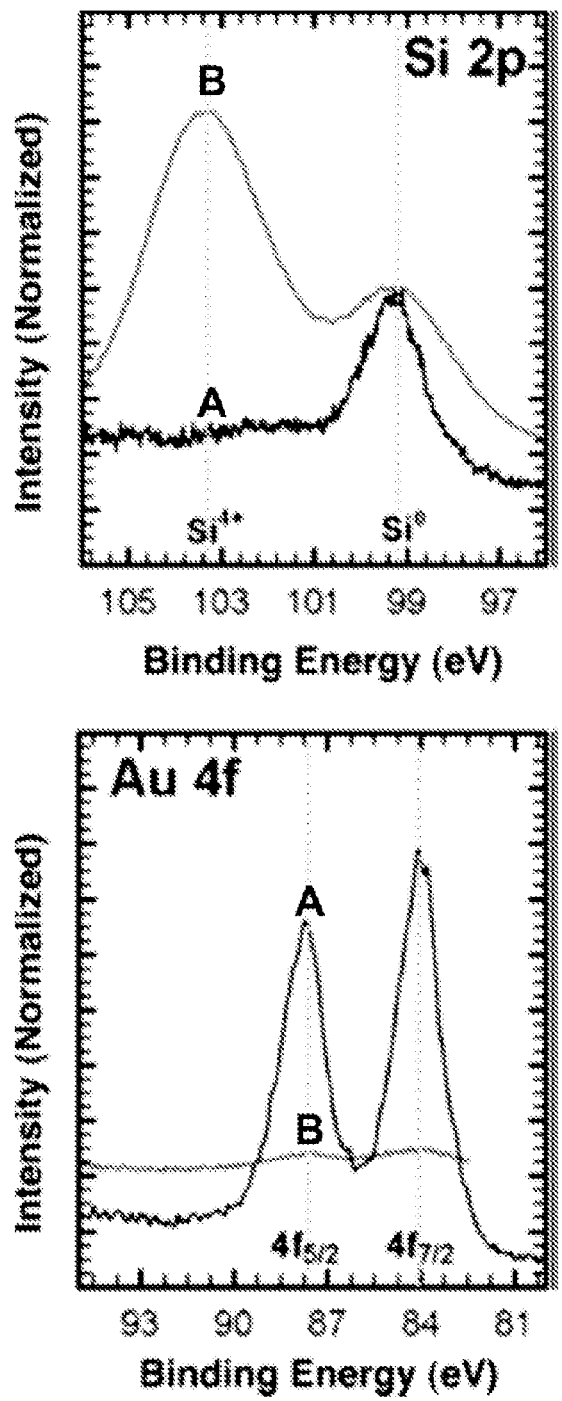
FIG. 18A-B depict XPS data for thermally quenched Si nanorods before (LINE A) and after 24 h exposure to an aqua regia/chloroform emulsion (LINE B). Both Au 4f and Si 2p peak intensities are normalized to the SiO peak intensity at 99.3 eV.

Changes in nanorod surface chemistry during Au etching in the samples of EXAMPLE 5 were evaluated by X-ray photoelectron spectroscopy (XPS). The XPS of nanorods before etching (see FIG. 18) exhibits a dominant $Si^0$ peak at 99.3 eV in the Si 2p region, with an additional lower intensity peak at 101.7 eV associated with a surface-bound amine. After the nanorods were etched for 24 hours, the XPS showed an intense peak at 103.3 eV, characteristic of $SiO_2$. The O 1s peak intensity also increases significantly after etching (not shown), consistent with the formation of a surface oxide layer. Nonetheless, the $Si^0$ peak is still present at 99.3 eV, confirming that the nanorods do not completely oxidize during the etching process.

There is also a loss of the Au $4f_{5/2}$ and $4f_{7/2}$ peaks in the XPS data after etching for 24 hours, confirming that the majority of the Au has been removed. The XPS data are consistent with the observed changes in nanorod dispersibility from nonpolar to polar solvents after the etching process.

EXAMPLE 7

This example illustrates the changes in the surface chemistry of the nanorods as a result of seed material etching.

EXAMPLE 4 was repeated, but without using a thermal quench to facilitate etching of the Au seed material. Instead, the reaction vessel was removed from its heating mantle after synthesis of the nanorods was completed, and was allowed to cool to ambient temperature. The nanorods were then subjected to etching to remove the seed materials as described in EXAMPLE 4.

It was found that very few Au seeds were removed from the tips of slowly cooled Si nanorods, even with 48 hours of exposure to aqua regia. The TEM of the sample (see FIG. 19) clearly shows that Au seeds are still present, despite the exposure of these nanorods to the same aqua regia mixture used to obtain the nanorods with nearly complete Au removal in FIG. 17.

Figure 19:
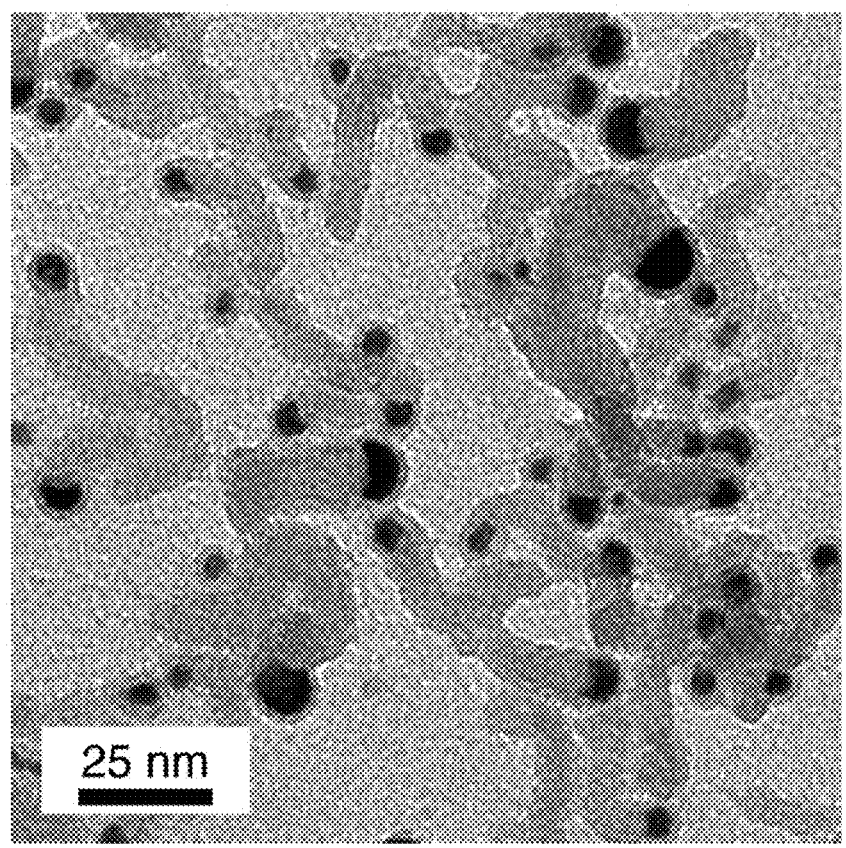
FIG. 19 is a TEM image of Si nanorods 24 hours after exposure to an aqua regia/chloroform emulsion.

As further proof that Au was not etched from the nanorod tips, the dispersion retained its dark brown/purple hue after exposure to the etchant. A silica shell (1.8 nm thick) forms around the Au seeds during exposure to the aqua regia mixture, as shown in FIG. 19. The Si shells oxidize uniformly and prevent the etching mixture from reaching the Au. As with the thermally quenched Si nanorods, the slowly cooled nanorods were dispersible in polar solvents such as alcohols after exposure to the etching solution.

Figure 20:
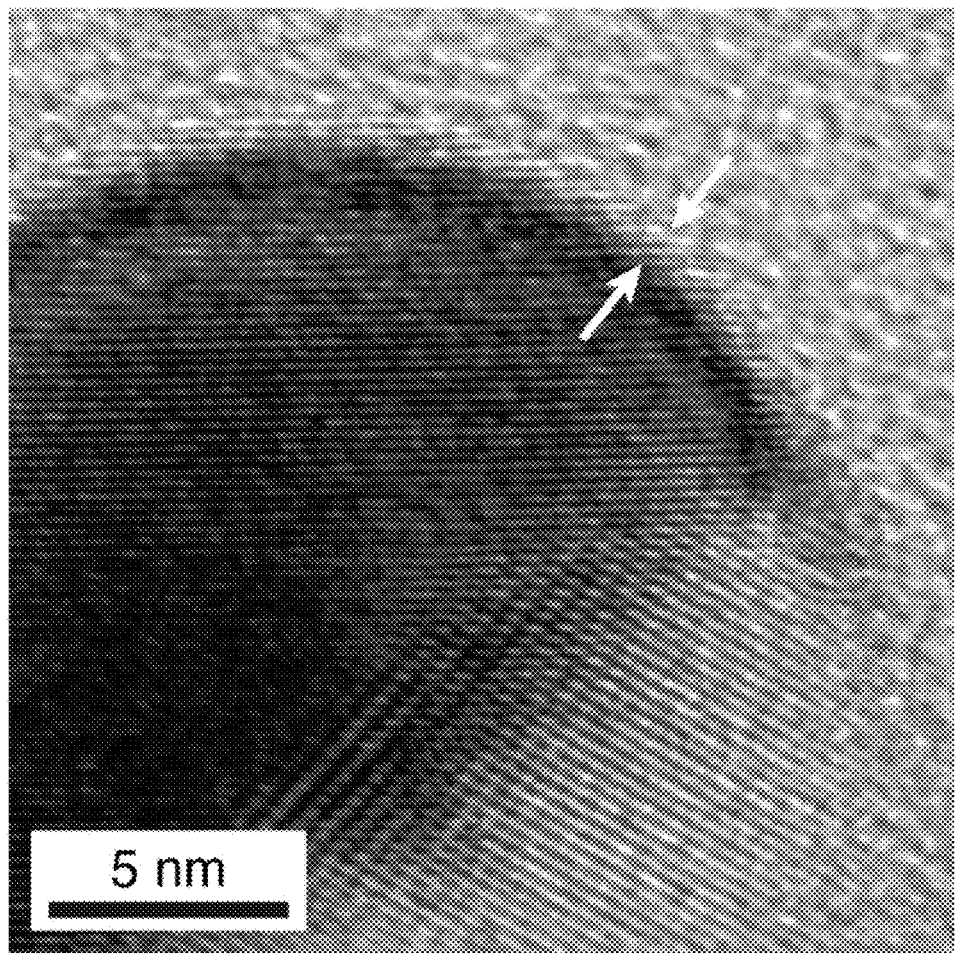
FIG. 20 is an HRTEM image of an Au seed at the tip of a Si nanorod prior to etching. The arrows indicate the location of the shell.

The inability to remove the tips from Au seeded Si nanorods is consistent with previous reports that have also not achieved complete Au removal using a one-step etching process. See Ferralis, N.; Maboudian, R.; Carraro, C. *J. Am. Chem. Soc.* 2008, 130, 2681-2685. As seen in FIG. 20, which shows an example of a high-magnification TEM image of an Au seed particle not subjected to thermal quenching and etching, the Au seed particle is covered by a thin, low contrast Si shell. Consequently, the Si shell around the seed particles is very difficult to detect prior to removing the Au from the tips of the nanorods. This appears to be the likely reason for the absence of any definitive reports of such a shell around the seed particle of VLS-grown nanowires.

After the Au seed particle is removed, the shell is clearly evident. The formation of such a shell is believed to be common to all VLS, SLS, and SFLS grown Si nanowires, and its presence should therefore be considered when developing a strategy for metal seed particle removal. The methodologies disclosed herein allow the existence of the shell to be verified after Au removal because the rapid thermal quench only disrupts the integrity of the shell and does not entirely remove it.

Figure 21:
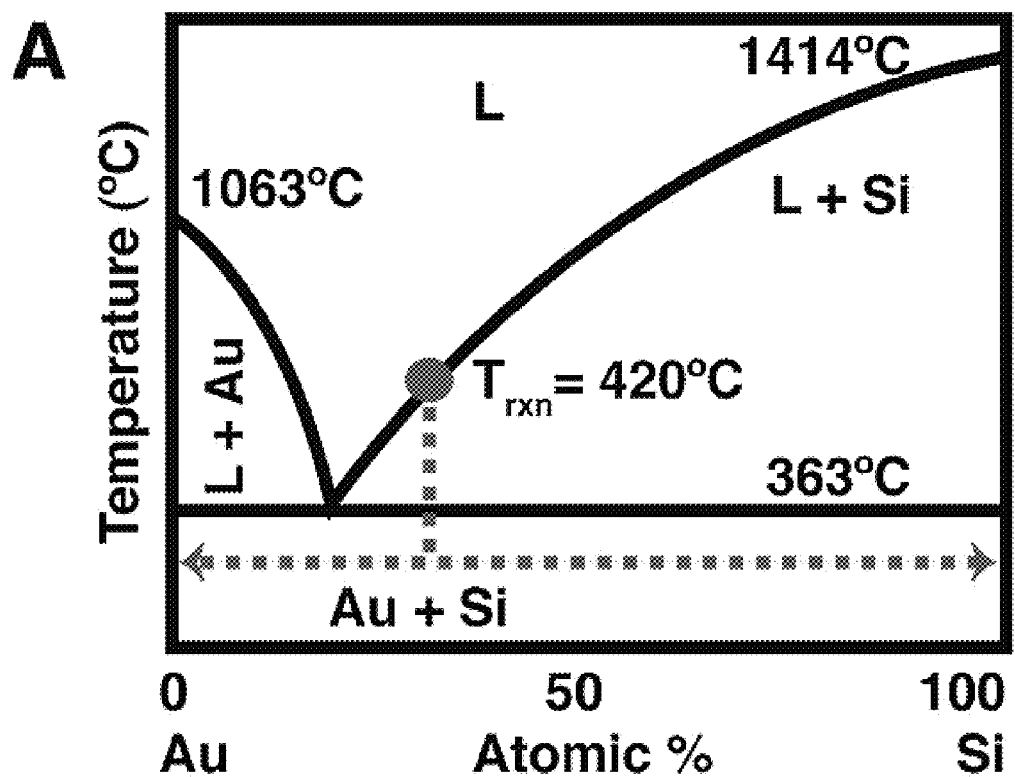
FIG. 21A is an Au:Si Binary phase diagram (L represents a liquid Au:Si phase). At the reaction temperature ($T_{rxn}$=420° C.) the Au:Si contains 20.5% dissolved Si. The dashed line depicts the nonequilibrium cooling and phase separation associated with thermal quenching.
FIG. 21B is an illustration of the Au seed etching process. The thermal quench of the reaction to below the eutectic temperature occurs in 5 seconds, while the slow cool takes 45 seconds to decrease to the same temperature.
Figure 21:
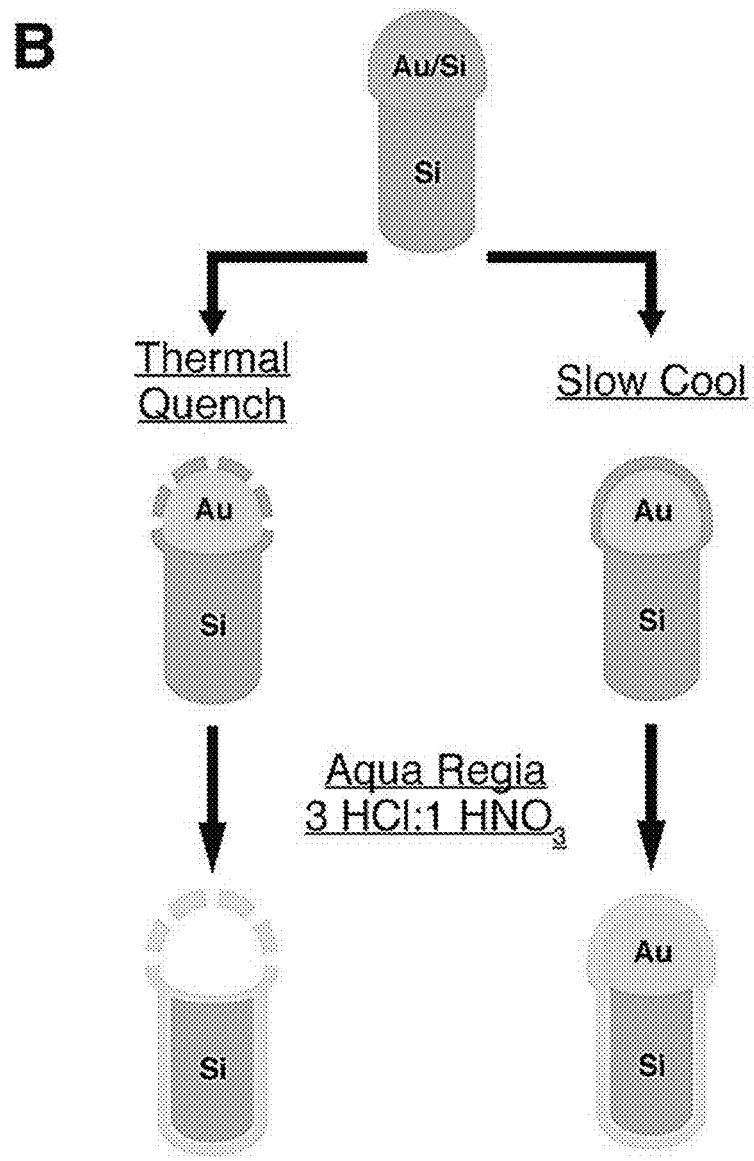

FIG. 21 summarizes the thermal quenching process and illustrates how it affects the Si shell and enables Au etching. Although the kinetics of how the quenching process leads to shell cracking is not yet fully understood, the Si shell appears to evolve when the Au—Si melt at the tip of the nanorod phase separates during cooling. When the reaction mixture is slowly cooled, a conformal Si shell forms around the Au seed particle. When the temperature is rapidly quenched, the shell integrity is disrupted.

Significant strain at the Au—Si interface would be expected after solidification, as there is nearly an order of magnitude difference between linear expansion coefficients of Au and Si (the expansion coefficients of the materials are $14.2 \times 10^{-6}$ $C.^{-1}$ and $2.6 \times 10^{-6}$ $C.^{-1}$, respectively). Rapid cooling appears to intensify the interfacial strain and increase the defect density in the shell, as illustrated in FIG. 21. The existence of the shell itself does not appear to be affected by the cooling rate, but the shell is noticeably more defective and is penetrated by the Au etchant (see FIG. 21B). Nanorods cooled slowly after the reaction have a shell that oxidizes uniformly, thus preventing the etchant from penetrating to the Au seeds.

EXAMPLE 8

This example illustrates the TEM analysis of nanorods produced in accordance with the general methodology described in EXAMPLE 2, and the characterization of the dimensions of these materials.

A sample of Si nanorods was obtained using a variation of the methodology described in EXAMPLE 2 in which a mixture of trisilane ($Si_3H_8$) and 2 nm diameter (dodecanethiol-stabilized) gold nanocrystals in dodecylamine were added to neat trioctylamine at 380° C. The Si:Au molar ratio used for the reaction was 40:1. The sample was then subjected to TEM analysis, the results of which are shown in FIGS. 1A and 1B.

FIG. 1A shows a histogram of nanorod diameters as determined by TEM analysis of 75 nanorods in the sample. The average diameter is 5.4±0.9 nm. The Au seed and cylindrical Si nanorod are outlined in FIG. 1B. The average nanorod diameter is 5.4±0.9 nm with aspect ratios ranging from 1.5 to 3.0.

EXAMPLE 9

This example illustrates the production of silicon nanorods of varying dimensions and aspect ratios in accordance with the methodologies disclosed herein.

As indicated in the discussion following EXAMPLE 2, the length of silicon nanorods may be adjusted in the methodologies described herein by varying the molar ratio Si:Au of the reaction chamber, and longer nanorods may be grown, for example, by increasing the amount of Si relative to Au in the reaction chamber. FIGS. 2A-2F are TEM images of Si nanorods with a diameter of 10 nm and of varying length which were produced using this approach. The nanorods have aspect ratios of (A) 2.3, (B) 1.6, (C) 3.4, (D) 3.1, (E) 4.8, and (F) 6.8. The nanorods were produced using the general methodology of EXAMPLE 2 with molar Si:Au ratios of (A-B) 20:1, (C-D) 40:1, or (E-F) 60:1 in refluxing squalane (420° C.; A, C, E) or octacosane (430° C.; B, D, F). Trisilane and Au nanocrystals in dodecylamine added to refluxing squalane produced Si nanorods with average diameters of 7 nm, whereas diameters of 9 nm were produced in reactions where refluxing octacosane was used as a solvent.

Nanorods were made using this approach that were as short as 5 nm and at least as long as 75 nm. It was found that the Si nanorod diameter could be increased above 5 nm by carrying the synthesis out at a higher temperature in non-coordinating solvents such as squalane or octacosane.

As EXAMPLE 9 indicates, silicon nanorods of any desired length may be made in accordance with the teachings herein by controlling the molar Si:Au ratios in the reaction mixture (taking into account choice of solvent and reaction temperature), or by controlling the molar ratio of silane to Au nanocrystals. Since the diameters of the nanorods may be controlled by controlling the dimensions of the Au seed crystals, this approach allows for control over both the length and diameters of the nanorods.

One skilled in the art will appreciate that the foregoing methodology is not limited to the synthesis of silicon nanorods through the thermal decomposition of silane precursor in the presence of gold nanocrystals (and optionally in the presence of a coordinating ligand), although this is a preferred embodiment of the methodology. More generally, this approach may be used in the synthesis of various types of nanostructures having various compositions to achieve desired dimensions in those nanostructures. Thus, the ratio of organometallic precursor to seed material, and/or the selection of seed particles of a certain dimensions, may be used to achieve nanostructures, and especially nanorods or nanowires, of a particular length and diameter, and having a chemical composition which is typically determined, at least in part, by the choice of precursor (or precursors). Preferably, the organometallic precursor reacts in the presence of the seed material (which preferably comprises Au nanocrystals, in the case of silane precursors) to form nanorods of a semiconductor material such as Si, Ge or alloys thereof.

EXAMPLE 10

This example illustrates the XRD and TEM characterization of nanorods produced in accordance with the methodologies disclosed herein.

Samples of silicon nanorods were produced using a variation of the methodology of EXAMPLE 2 which utilized a reaction mixture of Au nanocrystals and trisilane in dodecylamine added to squalane at 420° C.

Figure 3:
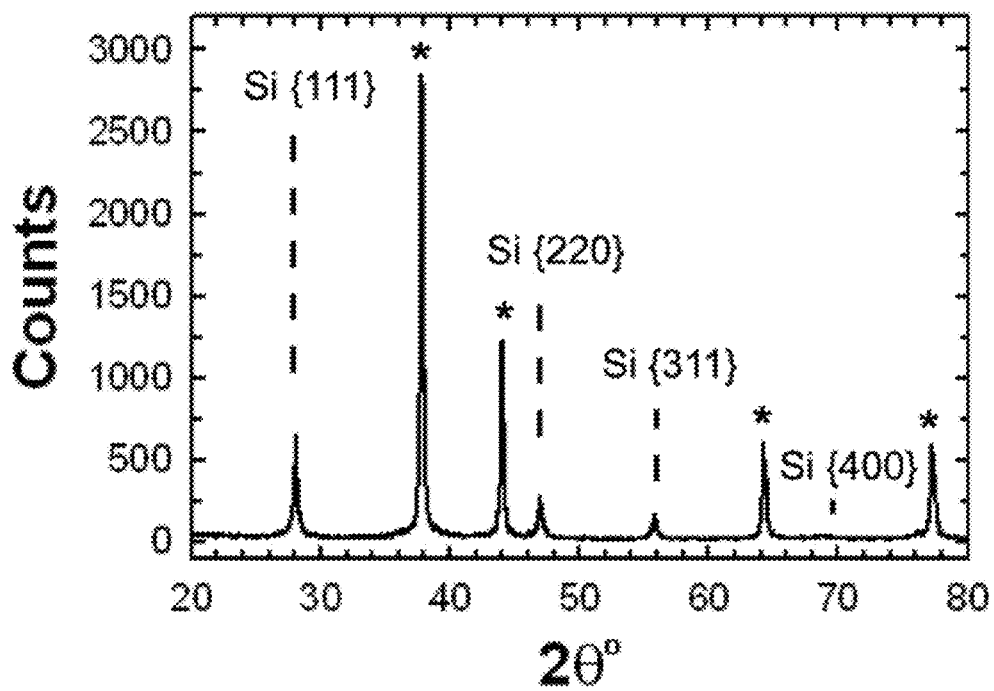
FIG. 3 is an XRD of Au-seeded Si nanorods synthesized in accordance with the methodologies taught herein.
Figure 10:
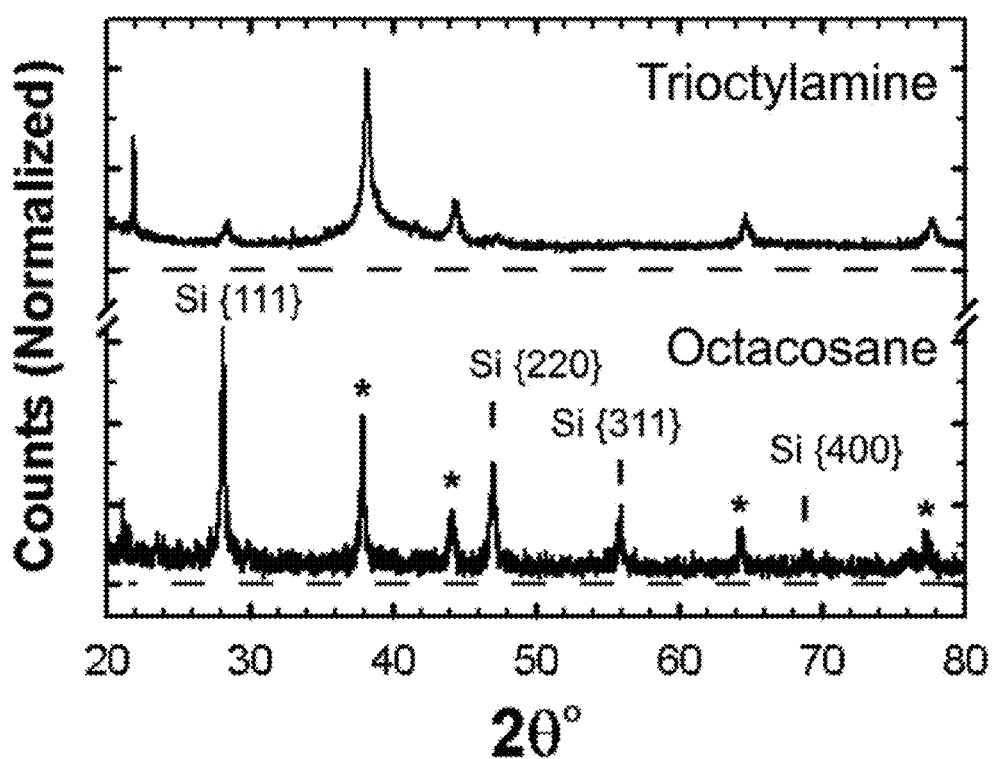
FIG. 10 is an XRD of Au seeded Si nanorods synthesized in trioctylamine (top) and octacosane (bottom).

XRD analysis was conducted on the samples. The results are depicted in FIG. 3. The pattern indexes to a combination of diamond cubic Si (PDF#027-1402, a=b=c=5.43088 Å) and Au (PDF#01-071-4073, a=b=c=4.07894 Å; peaks labeled with *). By way of comparison, FIG. 10 is an XRD of Au seeded Si nanorods synthesized using octacosane and trioctylamine as solvents.

Figure 4:
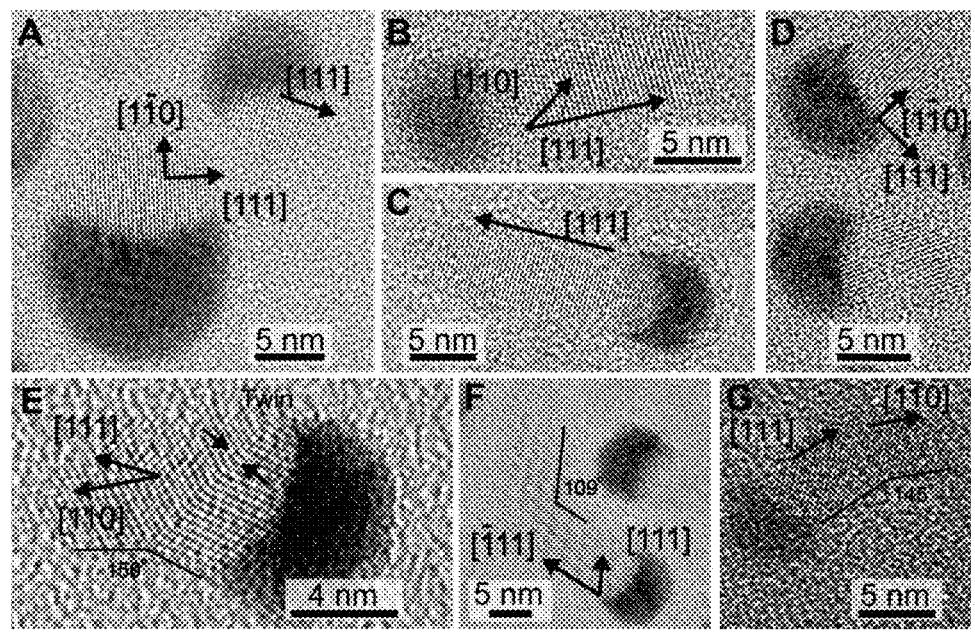
FIG. 4 is a series of TEM images of Si nanorods made in accordance with the teachings herein.

The samples were also subjected to TEM analysis. FIG. 4 is a series of TEM images of Si nanorods taken from that analysis. FIGS. 4A-D are high resolution TEM images of Si nanorods. FIGS. 4E-G show Si nanorods with kinks; the nanorod in FIG. 4E exhibits a twin defect. FIGS. 4F-G show Si nanorods that are bent, but are single crystalline and do not exhibit any obvious crystalline defects.

The XRD analysis (FIG. 3) and the TEM analysis (FIG. 4) confirmed that the nanorods were crystalline (diamond cubic) Si. Diffraction peaks corresponding to Au also appear in the XRD data as a significant amount of Au is present in the sample. From some reactions, the Au diffraction peaks in the XRD data were relatively narrow, indicating that agglomeration of Au occurred to some extent during those reactions. These samples were typically associated with Si nanorods with a broader diameter distribution. Sometimes, further separation of the larger diameter Au agglomerates or Si nanorods was required during the post work up of the products. The HRTEM images of the Si nanorods show that the crystalline Si is in intimate contact with the Au, as has been observed with all other XLS (X=V, S, or SF) growth, indicating that the nanorods are indeed seeded by the Au nanocrystals.

Nanorods grew primarily in the <111> direction (FIGS. 4B-C), although a significant number of nanorods were also observed with <110> growth direction or, in some cases, a growth direction that did not correspond to any obvious lattice direction (FIGS. 4A and 4D). Nanorods with a <110> growth direction generally had aspect ratios below 3. The nanorods were predominantly straight (FIGS. 4A-D), but a portion of the nanorods were kinked. Crystallographic defects were not observed in the majority of these kinked nanorods (FIGS. 4F-G), suggesting that the kink is not necessarily the result of twin formation. The kinks may be a result of starved growth followed by an additional growth period. FIG. 4F shows a kinked Si nanorod that grew initially in the [−111] direction before changing to a [111] growth direction. FIG. 4G shows a Si nanorod with a [110] direction that switched to a [111] growth direction. Twin defects were also observed in some kinked nanorods, as in FIG. 4E, but the kinks associated with twins were typically more abrupt compared to the kinks not associated with a twin.

The growth direction and Au/Si interfaces of shorter "acorn"-shaped nanorods were not as well defined as they were for the higher aspect ratio nanorods. The surfaces of the Si nanorods are sharply defined and no significant surface layer or oxide was observed by HRTEM.

EXAMPLE 11

This example illustrates the characterization, with x-ray photoelectron spectroscopy (XPS) and attenuated total internal reflectance Fourier transform infrared (ATR-FTIR) spectroscopy, of the surface chemistry of nanorods produced in accordance with the methodologies disclosed herein.

A sample of silicon nanorods was produced using a variation of the methodology of EXAMPLE 2 which utilized a reaction mixture of Au nanocrystals and trisilane in dodecylamine added to squalane at 420° C. The sample was subjected to XPS analysis in the range of Si2p and N1s binding energies. The sample was not exposed to the ambient atmosphere for more than 3 minute. By fitting the Si2p region to a model corresponding to $Si^0$ (99.3 eV, red), Si—N (101.7 eV, blue), and $Si^{4+}$ (103.3 eV, green), it was shown that minimal oxidation has occurred and that Si—N bonding dominates the broad peak. The peak in the N1s region was fit to $Si_3N_4$ (397.4 eV, blue).

A strong peak at 99.3 eV corresponding to zero valence Si was present, along with a weak shoulder at higher binding energy (from 101.3 and 103.3 eV), which corresponds to $Si^{2+}$, $Si^{3+}$, and $Si^{4+}$ species. The oxidized Si species may correspond to a number of possible surface compositions including $Si_3N_4$, SiC, $SiO_2$, or other suboxides.

The XPS data showed that nitrogen was present in the sample, with a peak at a binding energy of 397.2 eV in the N1s region. This binding energy is slightly lower than the N1s binding energy of bulk $Si_3N_4$ (397.4 eV), which suggests that N is in a slightly more electropositive environment than in bulk $Si_3N_4$ such that each N atom is bound to less than the 3 Si atoms in α or β-$Si_3N_4$. Si—N bonding from amines has been observed on organic monolayer coated planar Si surfaces and has been proposed to occur on the surface of metal catalyzed Si nanocrystals grown in the presence of trioctylamine. Thus, the high energy shoulder in the Si2p region is believed to correspond to Si—N bonding from the amine to the surface of the Si nanorods. Sputtering the sample with $Ar^+$ for 10 sec did not change the XPS data, which suggests that the nanorods have continuous and homogenous surface properties throughout the sample.

Figure 5:
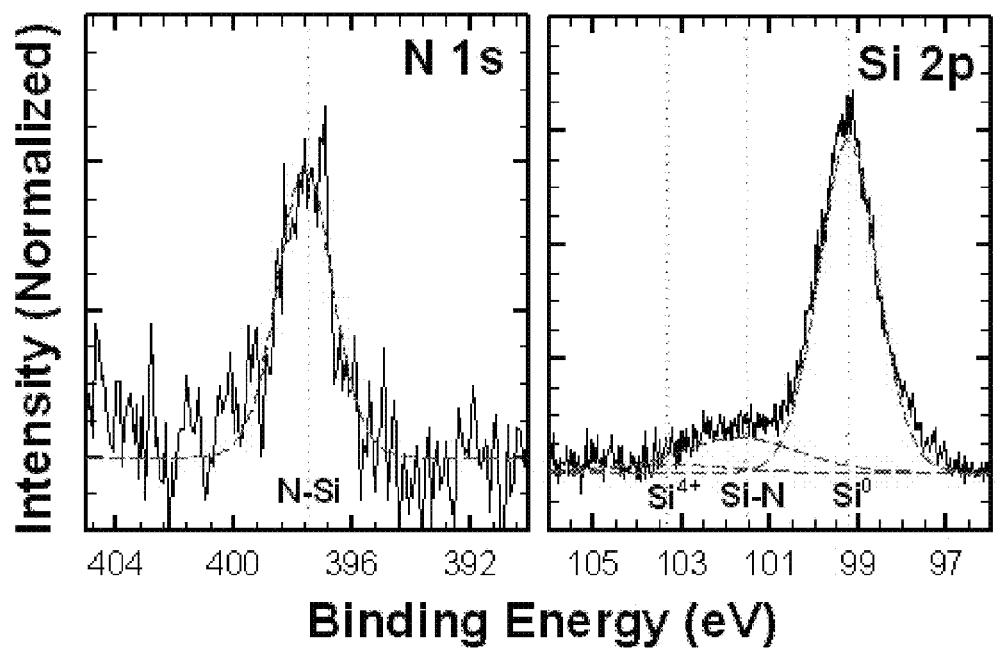
FIG. 5 is an XPS of Si nanorods made in accordance with the teachings herein.
Figure 6:
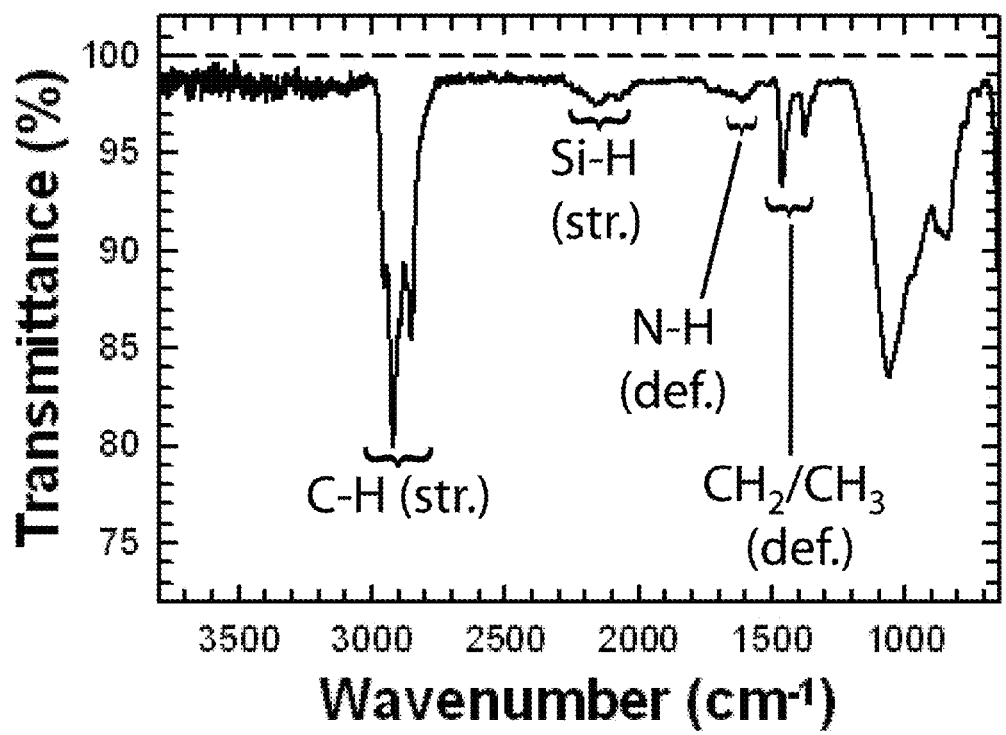
FIG. 6 is an ATR-FTIR spectra of Si nanorods made in accordance with the teachings herein.

The sample of nanorods was also subjected to ATR-FTIR spectroscopic analysis. FIG. 6 shows an ATR-FTIR spectrum of the Si nanorods examined by XPS in FIG. 5. As seen therein, alkyl hydrocarbon stretches are present, including the asymmetric and symmetric $CH_2/CH_3$ stretches between 2840-2975 $cm^{-1}$, methyl symmetric rocking between 1390-1370 $cm^{-1}$, and methyl asymmetric rocking/$CH_2$ scissoring at 1480-1440 $cm^{-1}$. N—H deformations (1650-1580 $cm^{-1}$) are also observed, indicating that dodecylamine is present on the nanorod surfaces. The N—H stretches at wave numbers greater than 3000 $cm^{-1}$ were not observed (a result believed to be due to larger noise and weak absorbance associated with this stretch), and vibrational modes due to Si—N bonding appear to be masked by a relatively broad featureless absorbance peak between 1200-750 $cm^{-1}$.

The broad absorbance feature covering wavenumbers 1200 to 750 $cm^{-1}$ covers much of the fingerprint region at wavenumbers below 1000 $cm^{-1}$, and could be assigned to a number of different species, including Si—O—Si or Si—O—C (1100-1000 $cm^{-1}$), C—N stretching from primary or secondary amines (1020-1190 cm$^{-1}$), Si-alkyl stretches (1175-1250 cm$^{-1}$), or Si—N—Si asymmetric stretches (~900 cm$^{-1}$). Spectral features in this range of wave numbers are typically assigned to silicon oxides, but XPS did not reveal significant surface oxidation. Additionally, the absorbance peak spans a larger wave number range than would be covered by silicon oxides, which suggests that other surface species contribute.

Silicon hydrides were also observed in the ATR-FTIR spectra. For example both Si—H (2090 cm$^{-1}$) and Si—H$_2$ (2150 cm$^{-1}$) stretches are present, which suggests that the nanorods are partially hydride terminated and that not all Si surface atoms are bound to dodecylamine. There is a significant concentration of hydrogen evolved during the trisilane decomposition reaction that could adsorb to the Si nanorod surfaces. Consistent with XPS, the overall ATR-FTIR spectra indicates that dodecylamine associates with a partially hydride terminated Si nanorod surface.

The experimental evidence set forth in EXAMPLE 11 suggests that dodecylamine associates with the Si nanorod surface. Thus, TEM images of the Si nanorods show sharply defined surfaces and no observable oxides, XPS data indicates Si—N bonding in the Si2p and N1s regions, and ATR-FTIR data indicates alkyl hydrocarbon and N—H vibrations. Without wishing to be bound by theory, it is believed that the amine plays a vital role in the synthesis by acting as a capping ligand to prevent agglomeration of nanorods and seed nanocrystals.

Figure 11:
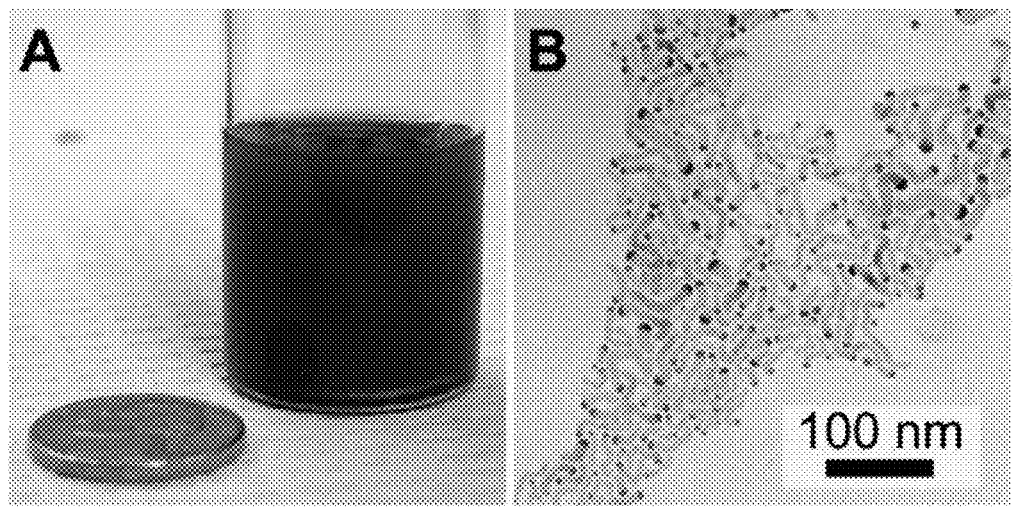
FIG. 11A is a digital photograph of a Si nanorod dispersion in chloroform.
FIG. 11B is a TEM image of the dispersion dropcasted into a carbon TEM grid.

Dodecylamine coats the nanorods and promotes dispersibility in organic solvents. This effect may be seen in FIG. 11A, which is a digital photograph of a Si nanorod dispersion in chloroform (1.5 mg/mL). The color of the dispersion is brown. FIG. 11B is a TEM image of the dispersion dropcasted into a carbon TEM grid. It is believed that dodecylamine mitigates Au nanocrystal coalescence in the reaction media, which is vital to the growth of small diameter Si nanorods. Here, it is to be noted that amines are known capping ligands for Au nanocrystals, and appear to provide steric stabilization even at the elevated temperatures used to grow the nanorods. This fact may be appreciated with respect to FIGS. 12A-D.

Figure 12:
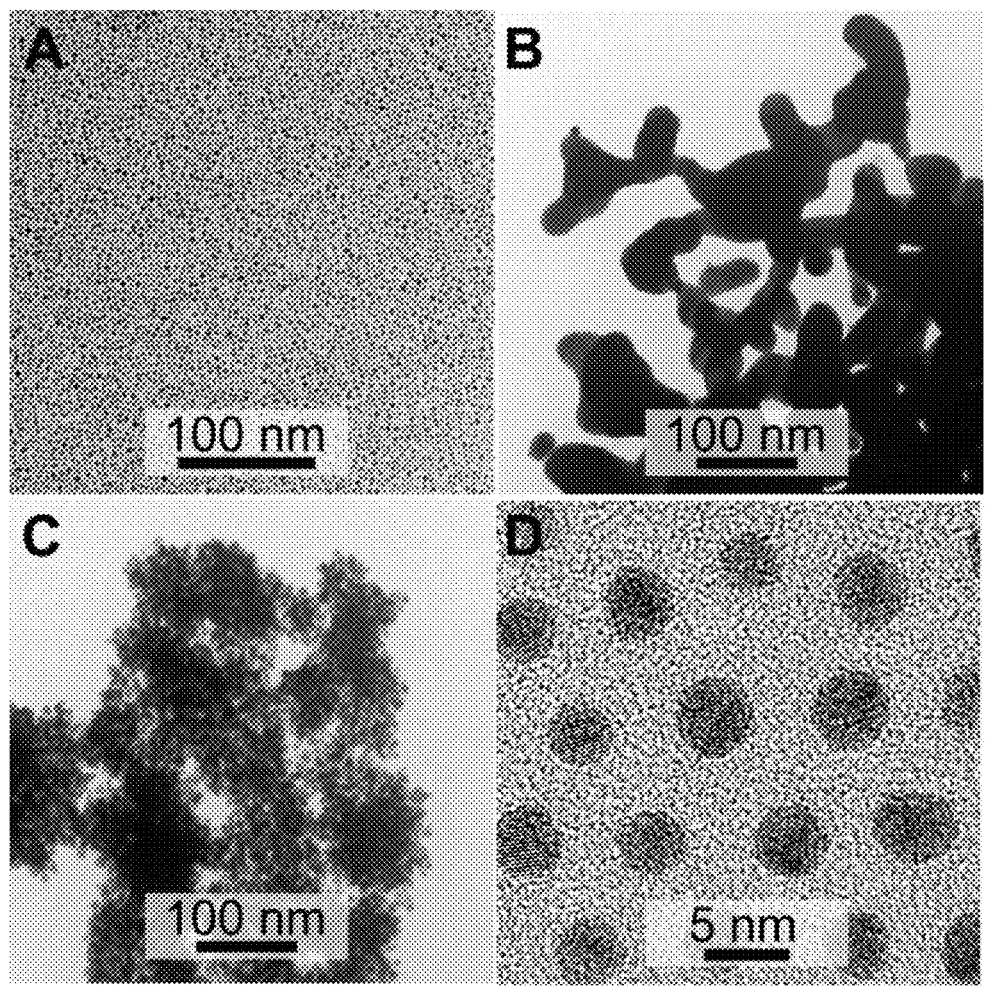
FIG. 12A is a TEM image of as-prepared 2 nm diameter Au seed nanocrystals.
FIG. 12B shows coalesced Au produced by injecting as-prepared 2 nm Au nanocrystals dissolved in benzene into squalane at 380° C.
FIG. 12C shows aggregated Au nanocrystals after injecting as-prepared 2 nm Au seed nanocrystals dissolved in dodecylamine into trioctylamine
FIG. 12D is an HRTEM image of excess free Au nanocrystals after injecting pre-synthesized 2 nm Au nanocrystals dissolved in dodecylamine and mixed with trisilane into trioctylamine.

FIG. 12A is a TEM image of as-prepared 2 nm diameter Au seed nanocrystals used in some of the Si nanorod syntheses described herein. FIG. 12B shows coalesced Au produced by injecting as-prepared 2 nm Au nanocrystals dissolved in benzene into squalane at 380° C. FIG. 12C shows aggregated 5-6 nm diameter Au nanocrystals after injecting as-prepared 2 nm Au seed nanocrystals dissolved in dodecylamine into trioctylamine at 380° C. FIG. 12D is an HRTEM image of excess free Au nanocrystals after injecting pre-synthesized 2 nm Au nanocrystals dissolved in dodecylamine and mixed with trisilane into trioctylamine at 380° C.

It will be appreciated from FIGS. 12A-D that, when 2 nm diameter Au nanocrystals seeds which are dissolved in dodecylamine or in benzene were injected into hot squalane (without trisilane), the Au nanocrystals in dodecylamine yielded 4-6 nm diameter Au nanocrystals, whereas benzene dissolved nanocrystals coalesced into large polycrystalline Au agglomerates. Not all agglomeration was prevented, and on average, Au seeds on the tips of the Si nanorods were between 4 and 6 nm in diameter, which suggests that the Au nanocrystals aggregate to some degree during the initial stages of nanorod growth. Based on these observations, it would appear that about eight to twenty-seven 2 nm Au seeds must coalesce to produce a 4-6 nm Au nanocrystal. Notably, silicon nanorods could not be produced by this method without adding dodecylamine.

Figure 7:
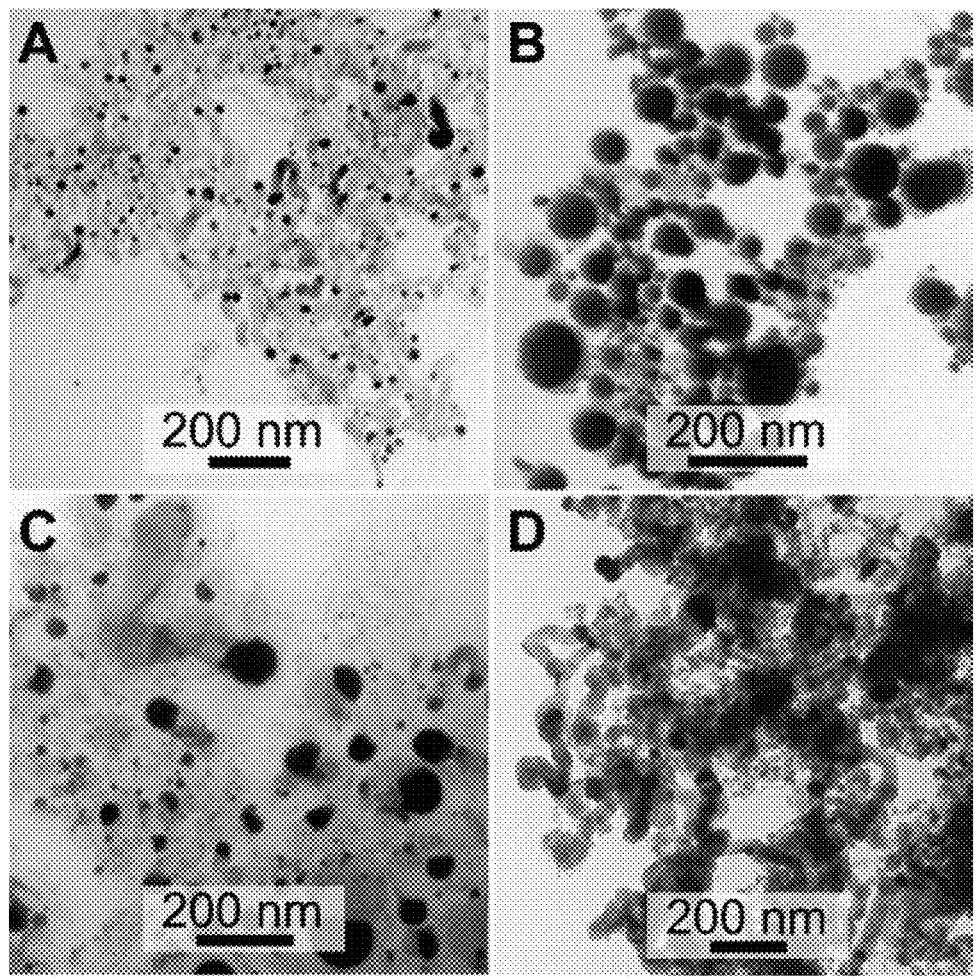
FIG. 7 is a series of TEM images of the products of attempted reactions involving Au nanocrystals disposed in various liquid media.

Substituting dodecylamine with other capping ligands in the synthesis was found to be detrimental to the production of Si nanorods. Thus, FIG. 7 is a series of TEM images of the product of attempted reactions in octacosane at 430° C., by dissolving Au NCs in (A) anhydrous benzene, (B) dodecanethiol, (C) dodecene, or (D) tridodecylamine before mixing with trisilane in a 40:1 Si:Au ratio and injecting into refluxing octacosane.

When anhydrous benzene was used, Si with nanowire morphologies were produced, but the length and diameter were not controllable. Additionally, there was extreme aggregation of the product. Reactions performed with the addition of dodecanethiol did not produce Si nanorods at all. The addition of dodecene led to polydisperse Si nanorods with much larger diameters. Tridodecylamine gave only ill-defined Si nanowires or large clumps of product.

Figure 13:
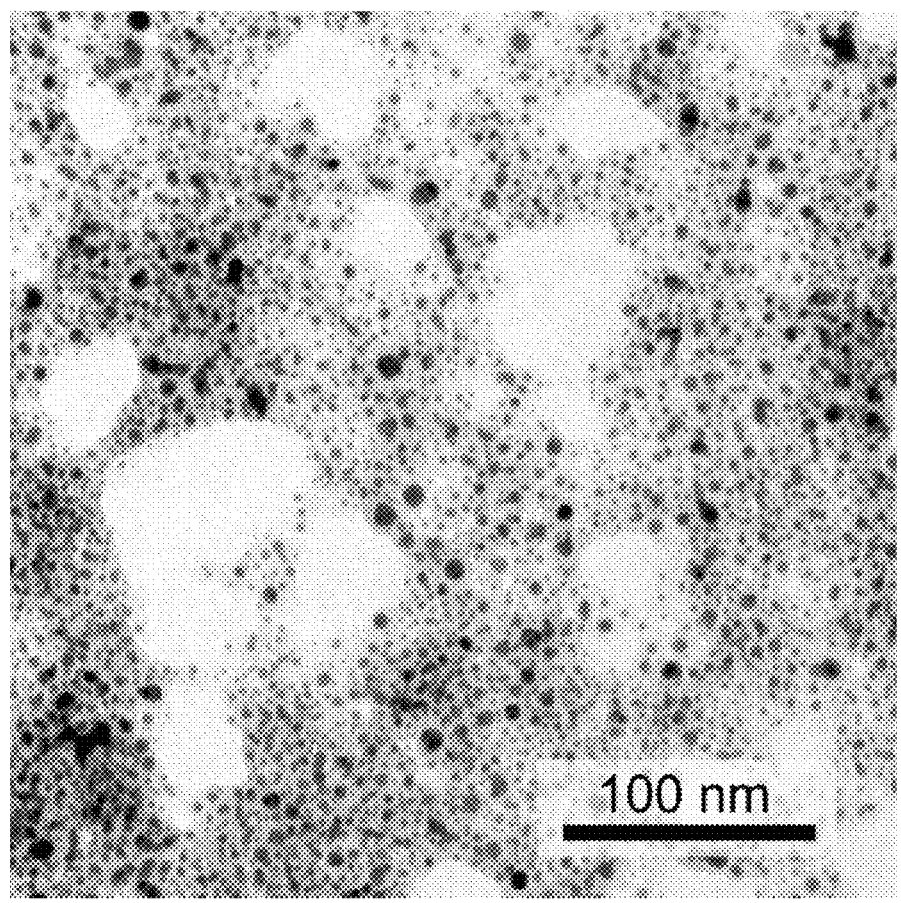
FIG. 13 is a TEM image of the product of a Si nanorod experiment where Au dissolved in dodecylamine was mixed with trisilane and injected into refluxing trioctylphosphine.

Trioctylphosphine was tested as an alternative coordinating solvent. Dissolving the Au nanocrystals in dodecylamine, mixing with trisilane, and injecting into refluxing trioctylphosphine [b.p. 380° C.] yielded no nanorods. Thus, FIG. 13 is a TEM image of the product of a Si nanorod experiment where Au dissolved in dodecylamine was mixed with trisilane and injected into refluxing trioctylphosphine at 380° C. As seen therein, this approach yielded no nanorods.

Figure 14:
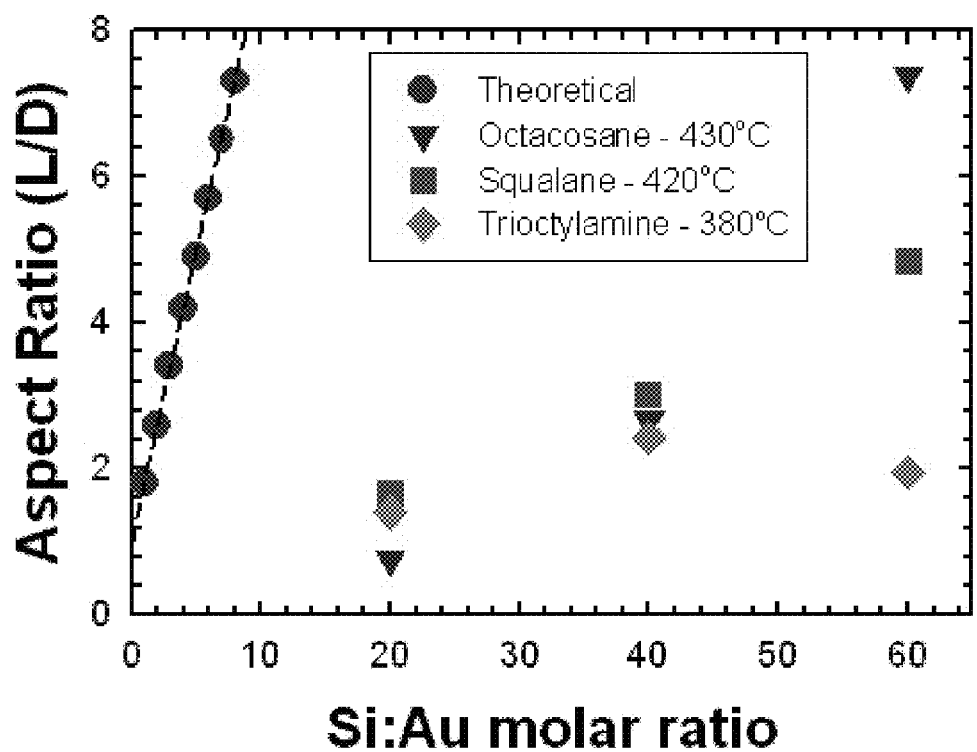
FIG. 14 is a graph of average Si nanorod aspect ratio versus the Si:Au molar ratio in the initial reactants.
Figure 15:
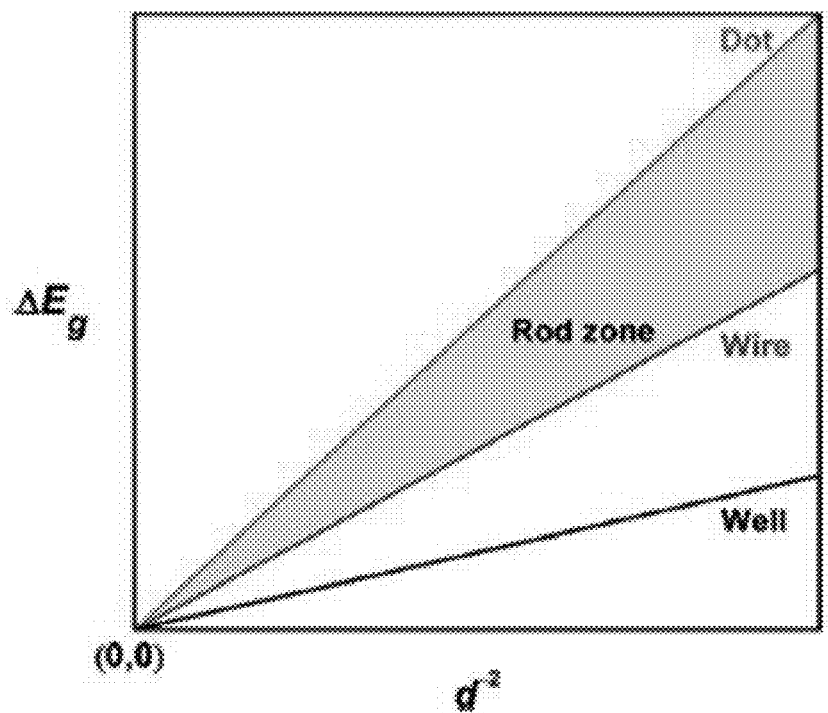
FIG. 15 is a graph showing the slope relationships for the size dependence (where d is thickness or diameter) of the effective band gaps ($\Delta_{EG}$S) in quantum wells QWs, QRs, and QDs composed of the same semiconductor material, as predicted by simple EMA-PIB models.

Amines do not appear to interfere with the decomposition of trisilane. However, the conversion of trisilane to Si nanorods is relatively low (about 10%). A comparison of experimental data versus the theoretical mass balance of Si and Au atoms introduced into the system illustrates the low conversion of trisilane. Thus, FIG. 14 is a graph of the average Si nanorod aspect ratio versus the initial reactants Si:Au molar ratio. A theoretical mass balance is also plotted assuming 100% conversion of the reactants. The experimental data is plotted with respect to the solvent and temperature at which the Si nanorods were synthesized—i.e., octacosane 430° C. (triangles), squalane 420° C. (squares), or trioctylamine 380° C. (diamonds). When trioctylamine was used as the solvent, there appeared to be a growth limit in length, unlike the reactions carried out in squalane or octacosane.

Plotting the injected Si:Au molar ratio versus the obtained aspect ratio of the nanorods of nine different reactions shows that reactions in trioctylamine yielded similar aspect ratios, independent of the amount of Si:Au injected. The aspect ratios of the nanorods made in squalane or octacosane increased with increasing Si:Au ratios. This implies that smaller and shorter nanorods form when trioctylamine is used as a solvent due to a lower availability of Si. The lower availability is believed to be a result of less Si atoms being liberated from trisilane at 380° C. (i.e., the boiling point of trioctylamine). When squalane (bp 420° C.) or octacosane (430° C.) is used as a solvent, the excess temperature makes more Si available to the growth of Si nanorods.

Various modifications and substitutions may be made in the processes described herein without departing from the scope of the teachings of this disclosure. Thus, for example, one skilled in the art will appreciate that the foregoing method for removing metal nanocrystals (or the material of the metal nanocrystals) from the nanorods is merely one particular, preferred, but non-limiting embodiment of this methodology. Hence, this methodology is not limited to the etching or removal of gold seed material from silicon nanorods, but may be used more generally to enhance the removal of a variety of types of seed crystals or seed materials from a variety of different types of nanostructures, including nanocrystals and nanowires. The nanostructures may also have various chemical compositions. Thus, while the nanostructures used in this methodology preferably comprise a semiconductor material such as Si, Ge or alloys thereof, various other materials may be used. Thus, for example, in some embodiments, the nanostructures may be formed from a Group IV metal organometallic precursor.

In some embodiments, the seeded nanostructures may be formed by any suitable method, including methods other than the type of liquid medium synthesis described in EXAMPLE 2. The seeded nanostructures are then preferably disposed in a suitable liquid medium which may be heated and rapidly cooled in accordance with the methodologies described herein to facilitate etching or removal of the seed materials therefrom.

Various means may be used to rapidly cool the liquid medium in accordance with this methodology. Preferably, this end is accomplished by adding a sufficient portion of a cooler liquid to the liquid medium to effectively thermally quench the heated liquid medium. The cooler liquid may be the same or different from the liquid medium and, in some embodiments, may comprise one or more of the components of the liquid medium. Preferably, the cooler liquid is at room temperature (about 23° C.), though embodiments are also possible where the cooler liquid is at other temperatures, or is chilled to below room temperature.

The temperature and volume of the cooler liquid will typically be chosen to achieve a desired cooling rate or temperature upon being mixed with the liquid medium. Typically, the volumetric ratio of the cooling liquid to the liquid medium is in the range of about 1:10 to about 10:1, preferably within the range of about 1:5 to about 5:1, more preferably within the range of about 1:3 to about 1:1, even more preferably within the range of about 2:5 to about 4:5, and most preferably is about 3:5.

The preferred rate at which thermal quenching occurs may depend on such factors as the composition of the seed materials, the composition of the nanostructures, and the reaction medium. Typically, however, the reaction medium is cooled from the reaction temperature to below the eutectic temperature of the seed material in less than about 30 seconds, preferably in less than about 20 seconds, more preferably in less than about 10 seconds, and most preferably in less than about 5 seconds. Typically, the reaction medium is cooled at least 20° C. over a time span of 5 seconds, preferably at least 30° C. over a time span of 5 seconds, more preferably at least 40° C. over a time span of 5 seconds, and most preferably at least 50° C. over a time span of 5 seconds. Typically, the reaction medium is cooled at a rate of at least 5° C./s, preferably at a rate of at least 8° C./s, more preferably at a rate of at least 11° C./s, and most preferably at a rate of at least 14° C./s.

Embodiments of this methodology are also possible in which the liquid medium is cooled by other means. For example, the vessel containing the liquid medium may be immersed in an ice bath or otherwise brought into contact with a heat sink. The liquid medium may also be exposed to, or passed over, a cooler surface or a surface equipped with heat fins, heat sinks or other components adapted to extract heat from it. In some embodiments, a condenser unit, a cooling coil, or other such device may be immersed in the liquid medium to withdraw heat from it. In other embodiments, the liquid medium may be atomized, sprayed, and/or directed through an orifice into an environment to achieve a cooling effect. The environment into which the liquid medium is sprayed may be sealed or controlled, and may contain an inert atmosphere. In still other embodiments, a gas may be discharged into the liquid medium to cool it.

As disclosed herein, Si nanorods with an average diameter at least as small as 5 nm and lengths at least as long as 75 nm were synthesized by an arrested SLS growth process. It was found that the aspect ratio may be tuned by adjusting the Si:Au molar ratio of the reactants. Primary amines (and especially dodecylamine) are preferred in the synthesis, since they appear to serve as capping ligands that prevent seed agglomeration and nanorod aggregation, while at the same time not influencing trisilane decomposition in a negative way. Here, it is to be noted that dodecylamine bonding to the Si nanorod surfaces was confirmed by FTIR spectroscopy and XPS as described herein.

Various precursors may be utilized in the methodologies and devices disclosed herein. Preferably, the precursor utilized is an organometallic precursor which may be a Group IV metal that includes organic groups. As used herein, a "Group IV metal" includes the elements of silicon, germanium, and tin. Generally, organometallic Group IV precursors are compounds that may be thermally degraded to form nanorods that are composed primarily of the Group IV metal. In some embodiments, the nanorod may contain a mixture of Group IV elements, such as $Si_xGe_{1-x}$, $Si_xSn_{1-x}$, or $Ge_xSn_{1-x}$. Organometallic Group IV precursors include, but are not limited to organosilicon, organogermanium and organotin compounds. Some examples of Group IV precursors include, but are not limited to, alkylgermaniums, alkylsilanes, alkylstannanes, chlorosilanes, chlorogermaniums, chlorostannanes, aromaticsilanes, and aromatic germaniums and aromaticstannanes. Particular examples of organometallic silicon precursors include, but are not limited to, tetraethyl silane or diphenylsilane. Particular examples of organometallic germanium precursors include, but are not limited to, tetraethylgermane or diphenylgermane. Preferably, however, the precursor is a silane, more preferably, the precursor is an alkylsilane, and most preferably, the precursor is trisilane.

While the methodologies and devices described herein are especially suitable for the formation of silicon nanorods, one skilled in the art will appreciate that these methodologies and devices may also be used in the formation of nanorods comprising various other materials. These include, without limitation, nanorods comprising Ge, and various alloys of the foregoing materials. In addition, these methodologies may be utilized, with appropriate modifications, to fabricate nanowires and nanocrystals.

While gold nanocrystals are the preferred seed material used in the methodologies and compositions described herein, in some embodiments, other metal seeds may be substituted for, or used in conjunction with, the Au metal seeds. Such other metal seeds include, but are not limited to, those comprising or consisting of Bi, Ni, Co, In, Ga, and Fe, and various alloys of the foregoing. The use of these metals (or alloys thereof) may change the optimum or desired temperature of the liquid medium or at which the synthesis is performed. In the case of Bi, for example, the use of such seeds may lower the synthesis temperature to 280° C. or less. It will be appreciated that the methodologies and chemistries used to remove these seed materials from the final product, if such is desired, may be selected based on the identity of the seed material.

Various concentrations of seed materials may be used in the methodologies disclosed herein. In the case of Au nanocrystals, the concentration is typically within the range of about 5 to about 250 mg/ml, preferably within the range of about 10 to about 120 mg/ml, more preferably within the range of about 20 to about 65 mg/ml, and most preferably within the range of about 25 to about 35 mg/ml.

The methodologies for synthesizing nanorods and other nanostructures in accordance the teachings herein may utilize a coordinating ligand. The coordinating ligand may interact with an organometallic precursor during formation of the nanostructures to assist in controlling the growth of the particle. The coordinating ligand may bond covalently to the particle surface, or stick through weak interactions, such as hydrogen bonding. The coordinating ligand may physisorb to the particle surface.

The choice of coordinating ligand may depend on such factors as the solvent system utilized, the chemical composition of the nanostructures, the reaction conditions, and other such factors. Preferably, however, the coordinating ligand is a material which is capable of serving as a capping ligand that prevents seed agglomeration and nanostructure aggregation, and that does not have an adverse impact on the decomposition of the precursor.

In the case of the synthesis of silicon nanorods, the coordinating ligand is preferably a primary amine, and more preferably dodecylamine. In some embodiments of the methodologies disclosed herein, however, the coordinating ligand may be a compound having the general formula $(R)_n$—X, where X is an atom or functional group capable of binding to the surface of the nanoparticles. The term "binding" refers to an interaction that associates the coordinating ligand with the nanoparticles. Such interactions may include ionic, covalent, dipolar, dative, quadrupolar or van der Walls interactions. Each R group may independently be hydrogen, an aryl group having between 1 and 20 carbon atoms or an alkyl group having between 1 and 20 carbon atoms. X may be an atom that includes, but is not limited to, nitrogen, carbon, oxygen, sulfur, and phosphorus. Alternatively, X may be a functional groups that includes, but is not limited to, a carboxylate, a sulfonate, an amide, an alkene, an amine, an alcohol, a hydroxyl, a thioether, a phosphate, an alkyne, an ether, or a quaternary ammonium group. Examples of coordinating ligands include, but are not limited to, alcohols, alkenes, alkynes, thiols, ethers, thioethers, phosphines, amines, amides, carboxylates, sulfonates, or quaternary ammonium compounds.

In some embodiments, the coordinating ligand may be an alcohol. Alcohols that may be used include n-alcohols having between 1 to 20 carbon atoms. An example of such an n-alcohol is 1-octanol. In other embodiments, the coordinating ligand may be an alkene. Alkenes that may be used include alpha-olefins having between 1 to 20 carbon atoms, or olefins with unsaturated chains. An example of such an alkene is 1-octene. In another embodiment the coordinating ligand may be a thiol. Thiols that may be used include 1-thiols having between 1 to 20 carbon atoms. An example of such a thiol is 1-thiooctanol.

Various materials may be used as the solvents or liquid media in the methodologies described herein. Such materials include, for example, materials having the chemical formula

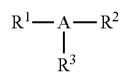

wherein A is N or P, and wherein each of $R^1$, $R^2$ and $R^3$ is a hydrocarbon moiety having at least 8 carbon atoms. Such materials also include phosphines, and especially tertiary phosphines having the formula $(R^1)_3$—P, where $R^1$ is a hydrocarbon moiety having at least eight carbon atoms. Such materials also include primary or tertiary amines, preferably those having the formula $NH_2$—$R^1$ or N—$(R^1)_3$, wherein $R^1$ is a hydrocarbon moiety preferably having at least 6 carbon atoms, more preferably having at least 9 carbon atoms, and most preferably having at least 12 carbon atoms. The liquid medium most preferably comprises dodecylamine, trioctylamine, squalene, or octacosane. Of course, one skilled in the art will appreciate that various mixtures of any of the foregoing materials may be employed in various embodiments of the methodologies disclosed herein.

Preferably, the liquid medium is heated sufficiently in the methodologies disclosed herein to induce decomposition of the precursor material which gives rise to the formation of nanorods or the particular type of nanostructures being synthesized. Typically, the liquid medium is heated above 340° C., preferably above 375° C., more preferably above 380° C., even more preferably above 420° C., and most preferably above 430° C., though it will be appreciated that the most preferred temperature range may vary from one embodiment to another depending, for example, on the liquid medium of choice, pressure, and other such considerations.

In the methodologies disclosed herein, the precursor utilized, which is preferably a silane, is subjected to thermal decomposition to form the nanorods. However, one skilled in the art will appreciate that, in some embodiments, other methodologies may be used in conjunction with, or in place of, thermal decomposition, including, without limitation, the use of photolytic methods using UV or e-beam sources in conjunction with peroxides or other reactive species.

The nanorods formed with the methodologies described herein may have various dimensions. Preferably, the nanorods have lengths within the range of about 1 nm to about 100 nm, and more preferably, the nanorods have lengths within the range of about 15 nm to about 75 nm. Preferably, the nanorods have an average diameter within the range of about 1.2 nm to about 10 nm, and more preferably, the nanorods have an average diameter within the range of about 5 nm to about 10 nm.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making silicon nanorods by reacting Au nanocrystals with a silane in a liquid medium, wherein each of said nanorods has an average diameter within the range of about 1.2 nm to about 10 nm and has a length within the range of about 1 nm to about 100 nm, wherein the Au nanocrystals are dispersed within the liquid medium and reacted with silane in the presence of a coordinating ligand, and wherein the liquid medium comprises a material selected from the group consisting of amines and phosphines.

2. The method of claim 1, further comprising:
   etching the Au nanocrystals after formation of the nanorods.

3. The method of claim 1, wherein the silane is $Si_3H_8$.

4. The method of claim 1, wherein the liquid medium comprises a primary amine.

5. The method of claim 1, wherein the liquid medium comprises an amine having the formula $NH_2$—$R^1$, and wherein $R^1$ is a hydrocarbon moiety having at least 6 carbon atoms.

6. The method of claim 4, wherein the liquid medium comprises an amine having the formula $NH_2$—$R^1$, and wherein $R^1$ is a linear hydrocarbon moiety having at least 12 carbon atoms.

7. The method of claim 1, wherein the liquid medium is heated above 340° C.

8. The method of claim 1, wherein the liquid medium is heated above 420° C.

9. The method of claim 1, further comprising:
forming a first mixture of a silane and a dispersion of Au nanocrystals in a first liquid medium; and
adding the first mixture to a second liquid medium which is heated above 375° C.

10. The method of claim 1, wherein the silicon nanorods are made by a solution-liquid-solid (SLS) process.

11. The method of claim 9, wherein the silicon nanorods are made by a solution-liquid-solid (SLS) process.

12. The method of claim 2, wherein the step of reacting Au nanocrystals with a silane in a liquid medium causes the formation of a plurality of Si nanorods, wherein each of said plurality of nanorods has one of said Au nanocrystals attached thereto, and wherein etching the Au nanocrystals after formation of the nanorods causes removal of the Au nanocrystal therefrom.

13. The method of claim 1, wherein the silicon nanorods have Au nanocrystals attached thereto, and further comprising:
rapidly cooling the liquid medium; and
subjecting the nanostructures to an etch to remove the material of the Au nanocrystals from the silicon nanorodes; wherein rapidly cooling the liquid medium involves cooling the reaction medium from the reaction temperature to below the eutectic temperature of a Si:Au mixture in less than about 30 seconds.

14. The method of claim 1, wherein the coordinating ligand is an amine.

15. The method of claim 1, wherein the liquid medium comprises trioctylamine.

16. The method of claim 4, wherein the liquid medium comprises an amine having the formula $NH_2-R^1$, and wherein $R^1$ is a linear hydrocarbon moiety having at least 9 carbon atoms.

17. The method of claim 1, wherein the liquid medium comprises dodecylamine.

18. The method of claim 1, wherein the liquid medium is heated above 375° C.

19. The method of claim 1, wherein the liquid medium is heated above 380° C.

20. The method of claim 1, wherein the liquid medium is heated above 375° C., and wherein the liquid medium comprises a material selected from the group consisting of tertiary phosphines.

21. The method of claim 20, wherein the tertiary phosphine has the formula $(R^1)_3-P$ and wherein $R^1$ is a hydrocarbon moiety having at least 8 carbon atoms.

22. The method of claim 1, wherein the liquid medium is heated above 430° C.

23. The method of claim 1, wherein the liquid medium is heated above 375° C., and wherein the liquid medium comprises a tertiary amine.

24. The method of claim 1, wherein the liquid medium is heated to a temperature within the range of about 360° C. to about 430° C.

25. A method for making silicon nanorods, comprising:
providing a solution of Au nanocrystals and an organic coordinating ligand;
forming a mixture of a silane and at least a portion of the solution;
adding the mixture to a reactor containing an organic liquid medium which has been heated above 375° C., thereby decomposing the silane and obtaining a reaction mixture of silicon nanorods attached to the Au nanocrystals; and
precipitating the silicon nanorods from the reaction mixture;
wherein said silicon nanorods have an average diameter within the range of about 1.2 nm to about 10 nm and a length within the range of about 1 nm to about 100 nm, and wherein the liquid medium comprises a material selected from the group consisting of amines and phosphines.

26. The method of claim 25, wherein the coordinating ligand is a primary amine.

27. The method of claim 25, wherein the volume of the liquid medium in the reactor prior to the addition of the mixture is greater than the volume of the mixture.

28. The method of claim 1, wherein the concentration of Au nanocrystals in the liquid medium is within the range of about 5 mg/mL to about 250 mg/mL.

29. The method of claim 1, wherein the concentration of Au nanocrystals in the liquid medium is within the range of about 10 mg/mL to about 120 mg/mL.

30. The method of claim 1, wherein the coordinating ligand stabilizes the nanowires.

* * * * *